(12) United States Patent
Van Dongen et al.

(10) Patent No.: US 12,468,234 B2
(45) Date of Patent: Nov. 11, 2025

(54) METHOD OF CONTROLLING A PATTERNING PROCESS, DEVICE MANUFACTURING METHOD

(71) Applicant: ASML NETHERLANDS B.V., Veldhoven (NL)

(72) Inventors: Jeroen Van Dongen, Houten (NL); Elliott Gerard McNamara, Eindhoven (NL); Paul Christiaan Hinnen, Veldhoven (NL); Marinus Jochemsen, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 453 days.

(21) Appl. No.: 16/641,677

(22) PCT Filed: Aug. 8, 2018

(86) PCT No.: PCT/EP2018/071498
§ 371 (c)(1),
(2) Date: Feb. 25, 2020

(87) PCT Pub. No.: WO2019/052747
PCT Pub. Date: Mar. 21, 2019

(65) Prior Publication Data
US 2020/0356013 A1    Nov. 12, 2020

(30) Foreign Application Priority Data
Sep. 18, 2017    (EP) .................................... 17191525

(51) Int. Cl.
*H01L 21/311*    (2006.01)
*G03F 7/00*    (2006.01)
*H01L 21/3065*    (2006.01)

(52) U.S. Cl.
CPC ...... *G03F 7/70633* (2013.01); *G03F 7/70625* (2013.01); *H01L 21/3065* (2013.01)

(58) Field of Classification Search
CPC ....................... H01L 21/31144; H01L 21/3043
See application file for complete search history.

(56) References Cited

U.S. PATENT DOCUMENTS

| 6,767,844 B2 | 7/2004 | Huang |
|---|---|---|
| 2003/0044728 A1 | 3/2003 | Terada et al. |

(Continued)

FOREIGN PATENT DOCUMENTS

| CN | 106062634 | 10/2016 |
|---|---|---|
| CN | 106104769 | 11/2016 |

(Continued)

OTHER PUBLICATIONS

Cybart et al. ("Nanometer scale high-aspect ratio trench etching at controllable angles using ballistic reactive ion etching", Nov. 23, 2012.*

(Continued)

*Primary Examiner* — Thomas T Pham
(74) *Attorney, Agent, or Firm* — Pillsbury Winthrop Shaw Pittman, LLP

(57) ABSTRACT

Methods of controlling a patterning process are disclosed. In one arrangement, tilt data resulting from a measurement of tilt in an etching path through a target layer of a structure on a substrate is obtained. The tilt represents a deviation in a direction of the etching path from a perpendicular to the plane of the target layer. The tilt data is used to control a patterning process used to form a pattern in a further layer.

18 Claims, 14 Drawing Sheets

(56) References Cited

U.S. PATENT DOCUMENTS

| | | |
|---|---|---|
| 2006/0016561 A1 | 1/2006 | Choi et al. |
| 2006/0033921 A1 | 2/2006 | Den Boef et al. |
| 2006/0066855 A1 | 3/2006 | Den Boef et al. |
| 2007/0238031 A1* | 10/2007 | Lee .............. H01L 21/0337 |
| | | 430/5 |
| 2008/0215276 A1 | 9/2008 | Fang et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2012/0008127 A1 | 1/2012 | Tel et al. |
| 2012/0242970 A1 | 9/2012 | Smilde et al. |
| 2013/0308142 A1 | 11/2013 | Straaijer |
| 2016/0061589 A1 | 3/2016 | Bhattacharyya et al. |
| 2016/0078166 A1* | 3/2016 | Unal ............... G03F 7/70508 |
| | | 716/51 |
| 2016/0349627 A1 | 12/2016 | Van Der Schaar et al. |
| 2017/0018407 A1* | 1/2017 | Kondo ........... H01L 21/32136 |
| 2017/0090302 A1* | 3/2017 | Slotboom ........ G03F 7/70633 |
| 2019/0096739 A1* | 3/2019 | Yang .............. H01L 21/31144 |

FOREIGN PATENT DOCUMENTS

| | | |
|---|---|---|
| JP | 2000303193 | 10/2000 |
| JP | 2004510152 | 4/2004 |
| JP | 2015201552 | 11/2015 |
| JP | 2016033656 | 3/2016 |
| JP | 2017526973 | 9/2017 |
| KR | 20080029609 | 4/2008 |
| KR | 20160124850 | 10/2016 |
| WO | 2009078708 | 6/2009 |
| WO | 2009106279 | 9/2009 |
| WO | 2015124391 | 8/2015 |
| WO | 2017067765 | 4/2017 |
| WO | 2017102304 | 6/2017 |

OTHER PUBLICATIONS

Siwei et al. ("Method for ion beam etching in angles with multi-layers model", Nov. 23, 2012, Proc. SPIE 9683, 8th International Symposium on Advanced Optical Manufacturing and Testing Technologies: Advanced Optical Manufacturing Technologies, 96830L (Oct. 28, 2016)).*

International Search Report and Written Opinion issued in corresponding PCT Patent Application No. PCT/EP2018/071498, dated Sep. 28. 2018.

Japanese Office Action issued in corresponding Japanese Patent Application No. 2020-510516, dated Feb. 26, 2021.

Korean Office Action issued in corresponding Korean Patent Application No. 10-2020-7005836, dated Jul. 15, 2021.

Chinese Office Action issued in corresponding Chinese Patent Application No. 2018800601071, dated Aug. 27, 2021.

Chinese Office Action issued in corresponding Chinese Patent Application No. 2018800601071, dated Mar. 23, 2022.

* cited by examiner

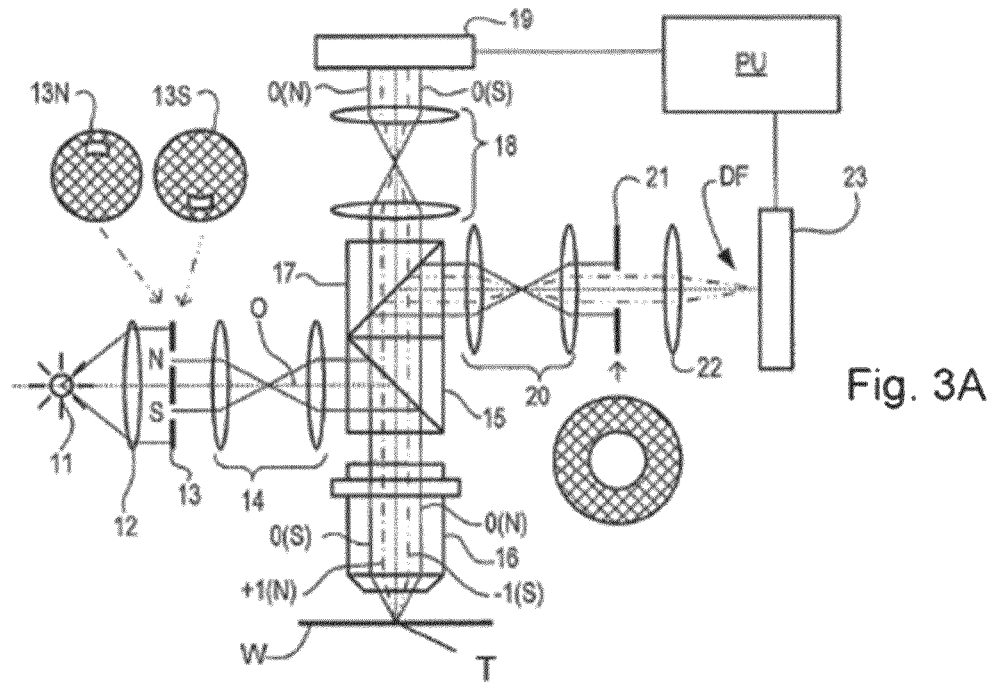
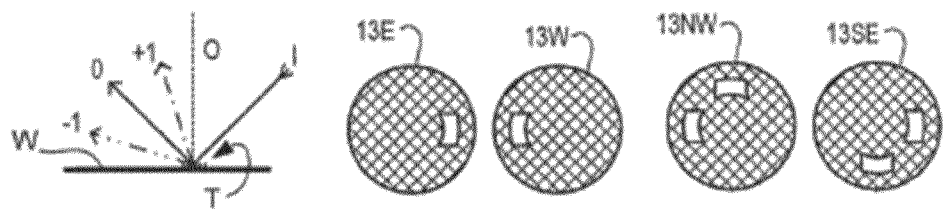
Fig. 3B  Fig. 3C  Fig. 3D
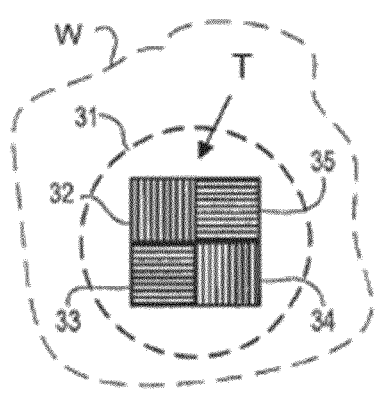
Fig. 4
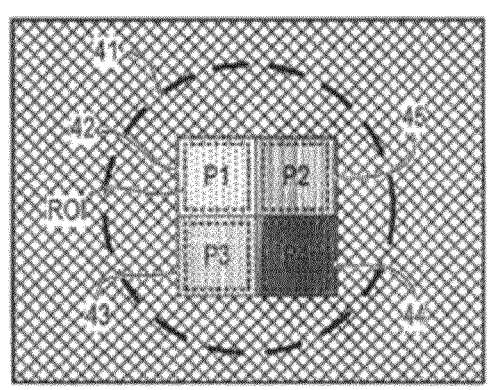
Fig. 5

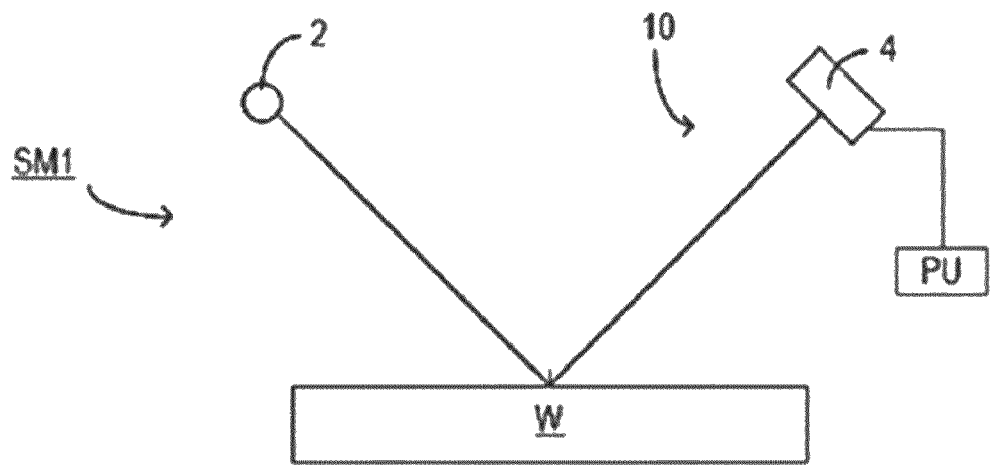
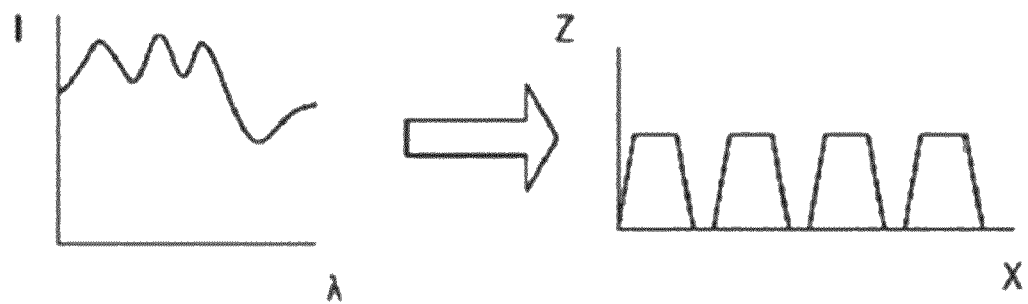
Fig.6

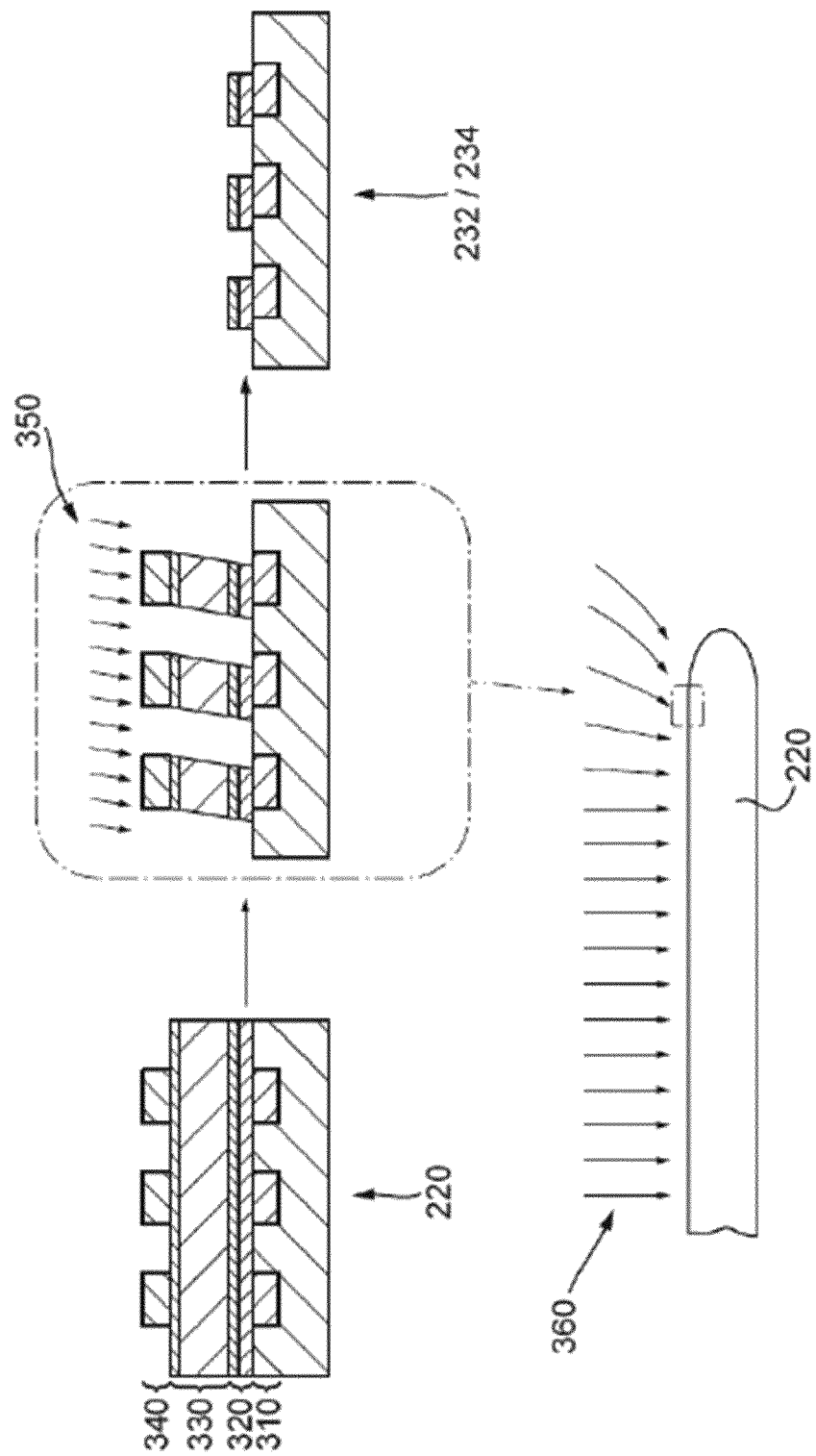

METHOD OF CONTROLLING A PATTERNING PROCESS, DEVICE MANUFACTURING METHOD

CROSS-REFERENCE TO RELATED APPLICATIONS

This application is the U.S. national phase entry of PCT/EP2018/071498, which was filed on Aug. 8, 2018, which claims the benefit of priority of European patent Application Serial No. 17191525.9, which was filed on Sep. 18, 2017, and which is incorporated herein in its entirety by reference.

FIELD

The present description relates to a method of controlling a patterning process and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

Manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are involved in the patterning process.

Metrology processes are used at various steps during a patterning process to monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be designed or altered, e.g., based on the measurements of the one or more characteristics, such that substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. The requirement of accuracy in terms of overlay, critical dimension (CD), etc. has become more and more stringent. Error, such as error in overlay, error in CD, etc., will inevitably be produced in the patterning process. For example, imaging error may be produced from optical aberration, patterning device heating, patterning device error, and/or substrate heating and can be characterized in terms of, e.g., overlay, CD, etc. Additionally, error may be introduced in other parts of the patterning process, such as during etching steps.

It is desirable to reduce errors in patterning processes used for manufacturing semiconductor devices.

According to an aspect, there is provided a method of controlling a patterning process, comprising: obtaining tilt data resulting from a measurement of tilt in an etching path through a target layer of a structure on a substrate, the tilt representing a deviation in a direction of the etching path from a perpendicular to the plane of the target layer; and using the tilt data to control a patterning process used to form a pattern in a further layer.

According to an aspect, there is provided a device manufacturing method, comprising: forming a structure comprising a target layer on a substrate; obtaining tilt data resulting from a measurement of tilt in an etching path through the target layer, the tilt representing a deviation in a direction of the etching path from a perpendicular to the plane of the target layer; and using the tilt data to control a patterning process used to form a pattern in a further layer.

BRIEF DESCRIPTION OF THE DRAWINGS

Embodiments will now be described, by way of example only, with reference to the accompanying schematic drawings in which corresponding reference symbols indicate corresponding parts:

FIG. 3A is schematic diagram of a measurement apparatus for use in measuring targets according to an embodiment using a first pair of illumination apertures providing certain illumination modes;

FIG. 3B is a schematic detail of a diffraction spectrum of a target for a given direction of illumination;

FIG. 3C is a schematic illustration of a second pair of illumination apertures providing further illumination modes in using a measurement apparatus for diffraction based overlay measurements;

FIG. 3D is a schematic illustration of a third pair of illumination apertures combining the first and second pairs of apertures providing further illumination modes in using a measurement apparatus for diffraction based overlay measurements;

FIG. 4 schematically depicts a form of multiple periodic structure (e.g., multiple grating) target and an outline of a measurement spot on a substrate;

FIG. 5 schematically depicts an image of the target of FIG. 4 obtained in the apparatus of FIG. 3;

FIG. 6 schematically depicts an example of a metrology apparatus and metrology technique;

FIG. 11 illustrates schematically a source of etching induced overlay error;

DETAILED DESCRIPTION

Before describing embodiments of the invention in detail, it is instructive to present an example environment in which embodiments of the present invention may be implemented.

Figure 1:
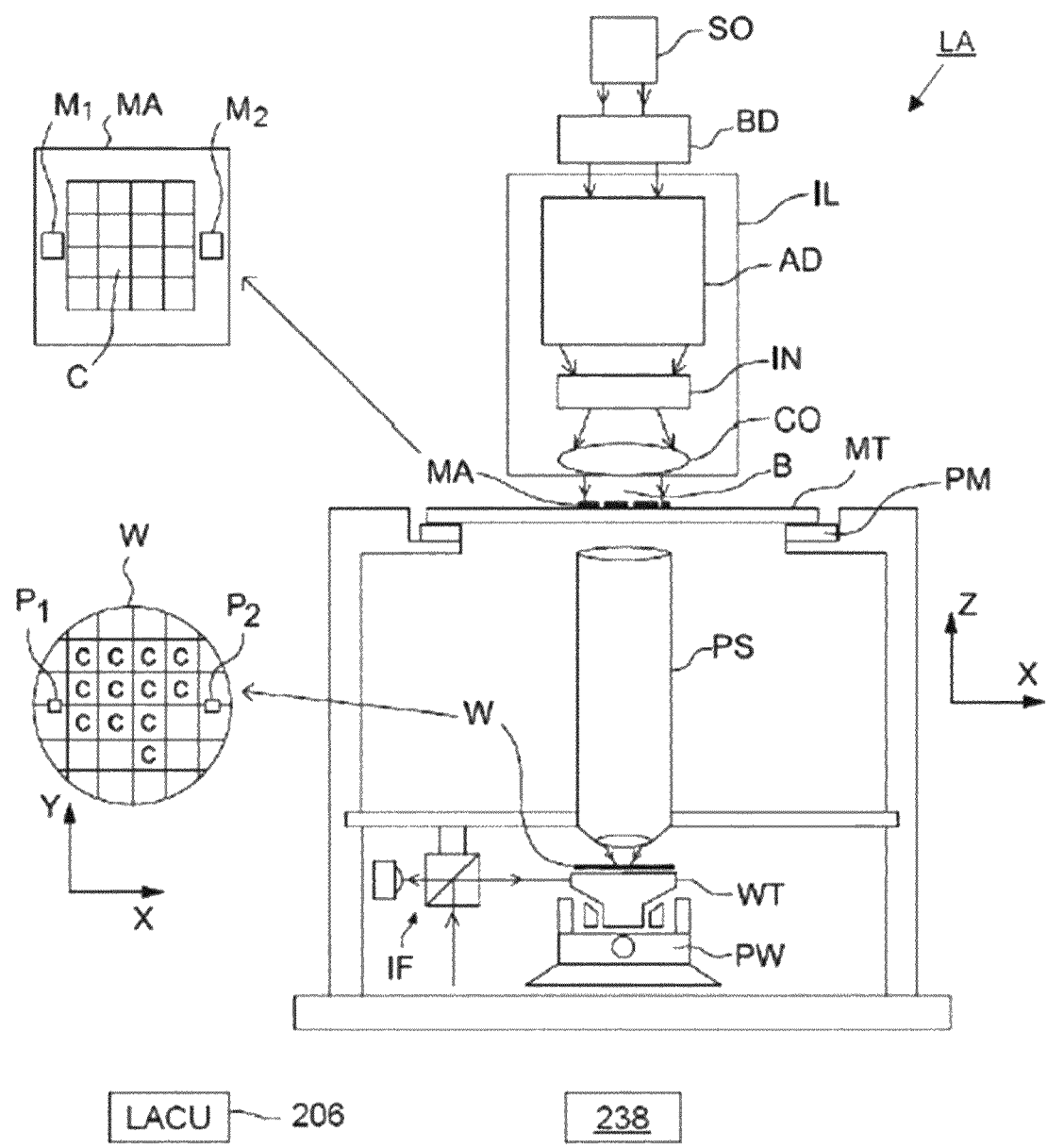
FIG. 1 depicts a lithographic apparatus.

FIG. 1 schematically depicts a lithographic apparatus LA. The apparatus comprises:

an illumination system (illuminator) IL configured to condition a radiation beam B (e.g. UV radiation or EUV radiation).

a support structure (e.g. a mask table) MT constructed to support a patterning device (e.g. a mask or reticle) MA and connected to a first positioner PM configured to accurately position the patterning device in accordance with certain parameters;

a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that may be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device (or a number of devices) being created in the target portion, such as an integrated circuit. The patterning device may be transmissive or reflective. Examples of patterning devices include masks, programmable mirror arrays, and programmable LCD panels.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb is moved accurately, e.g. so as to position different target portions C in the path of the radiation beam B. Similarly, the first positioner PM and another position sensor (which is not explicitly depicted in FIG. 1) is used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (fields), and/or between device areas (dies) within target portions. These are known as scribe-lane alignment marks, because individual product dies will eventually be cut from one another by scribing along these lines. Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C may be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A so-called dual stage type of lithographic apparatus which has two substrate tables and two stations—an exposure station and a measurement station—between which the substrate tables may be exchanged. While one substrate on one substrate table is being exposed at the exposure station, another substrate is loaded onto the other substrate table at the measurement station so that various preparatory steps may be carried out. The preparatory steps may include mapping the surface height of the substrate using a height sensor and measuring the position of alignment marks on the substrate using an alignment sensor. The measurement is time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU 206 which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
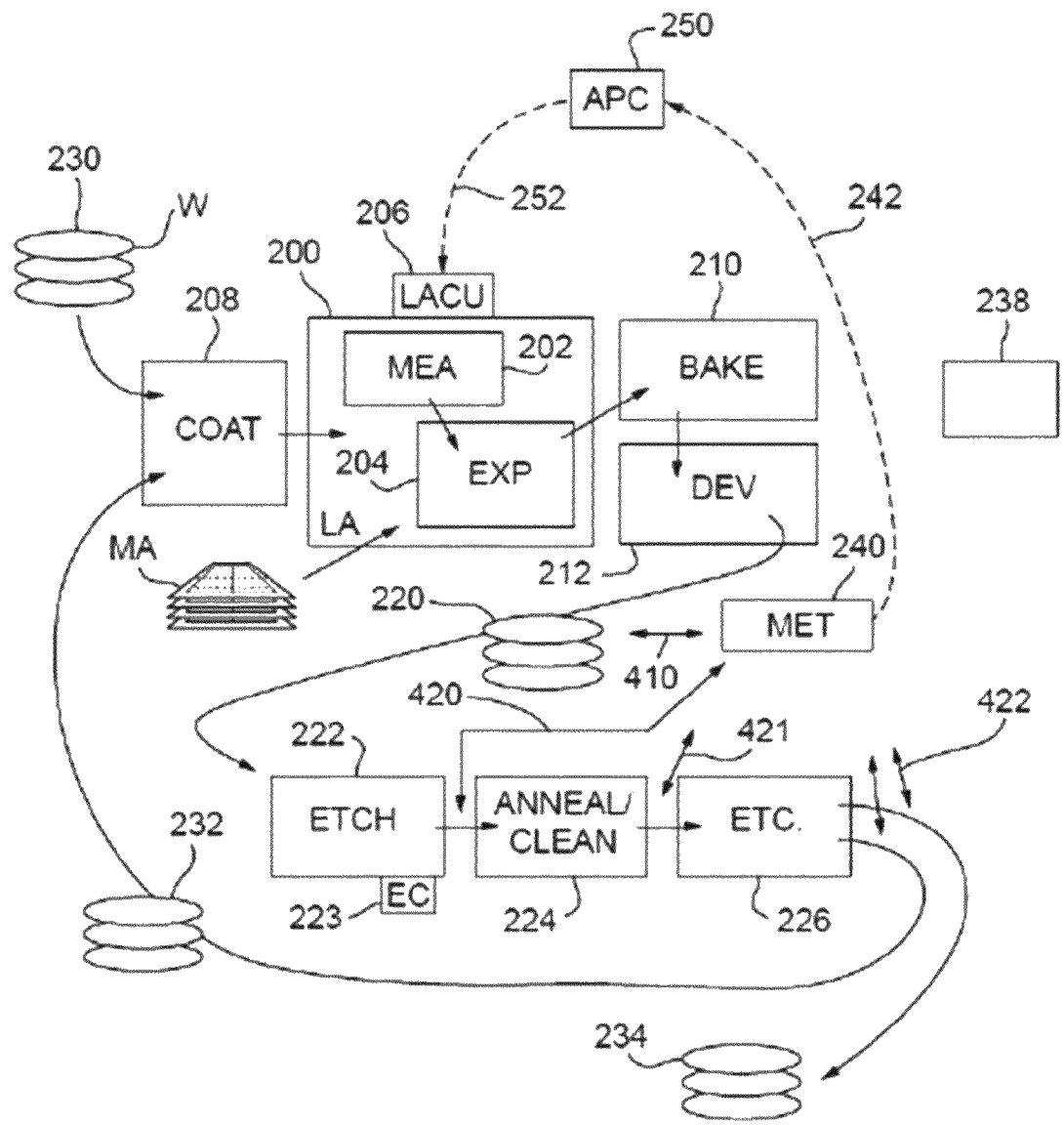
FIG. 2 depicts use of the lithographic apparatus of FIG. 1 with other apparatuses to form a production facility for semiconductor devices.

FIG. 2 at 200 shows the lithographic apparatus LA in the context of an industrial production facility for semiconductor products. Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps is implemented by various apparatuses in a typical manufacturing facility. Apparatus 222 in this embodiment is an etching station, and apparatus 224 performs a post-etch cleaning and/or annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products (substrates 234) to be sent for dicing and packaging.

Each layer of the product structure requires a different set of process steps, and the apparatuses 226 used at each layer may be completely different in type. Moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

The whole facility may be operated under control of a supervisory control system 238, which receives metrology data, design data, process recipes and the like. Supervisory control system 238 issues commands to each of the apparatuses to implement the manufacturing process on one or more batches of substrates.

Also shown in FIG. 2 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 may be used in an advanced process control (APC) system 250 to generate signals 252 to maintain accurate performance of the patterning operations in the litho cluster, by control unit LACU 206 making small adjustments over time, thereby minimizing the risk of products being made out-of-specification, and requiring re-work. Metrology apparatus 240 and/or other metrology apparatuses (not shown) may be applied to measure properties of the processed substrates 232, 234, and incoming substrates 230.

The advanced process control (APC) system 250 may for example be configured to calibrate individual lithographic apparatuses and to allow different apparatuses to be used more interchangeably. Improvements to the apparatuses' focus and overlay (layer-to-layer alignment) uniformity have recently been achieved by the implementation of a stability module, leading to an optimized process window for a given feature size and chip application, enabling the continuation of the creation of smaller, more advanced chips. The stability module in one embodiment automatically resets the system to a pre-defined baseline at regular intervals, for example each day. More detail of lithography and metrology methods incorporating the stability module can be found in US2012008127A1.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

A metrology apparatus suitable for use in embodiments to measure, e.g., overlay is schematically shown in FIG. 3A. A target T (comprising a periodic structure such as a grating) and diffracted rays are illustrated in more detail in FIG. 3B. The metrology apparatus may be a stand-alone device or incorporated in either the lithographic apparatus LA, e.g., at the measurement station, or the lithographic cell. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4 F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals.

As shown in FIG. 3B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3A and 3B are shown somewhat off axis, purely to enable them to be more easily distinguished in the diagram. At least the 0 and +1 orders diffracted by the target on substrate W are collected by objective lens 16 and directed back through prism 15.

Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1st and the +1st diffraction order intensities. Comparing these intensities for a given target provides a measurement of asymmetry in the target, and asymmetry in the target can be used as an indicator of a parameter of a lithography process, e.g., overlay. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements. The pupil plane image can also be used for other measurement purposes such as reconstruction, as described further hereafter.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane of the objective lens 16. Aperture stop 21 functions to block the zeroth order diffracted beam so that the image of the target formed on sensor 23 is formed from the −1 or +1 first order beam. Data regarding the images measured by sensors 19 and 23 are output to processor and controller PU, the function of which will depend on the particular type of measurements being performed. Note that the term 'image' is used in a broad sense. An image of the periodic structure features (e.g., grating lines) as such will not be formed, if only one of the −1 and +1 orders is present.

The particular forms of aperture plate 13 and stop 21 shown in FIG. 3 are purely examples. In another embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIGS. 3C and D. FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3C, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

FIG. 4 depicts an example composite metrology target T formed on a substrate. The composite target comprises four periodic structures (in this case, gratings) 32, 33, 34, 35 positioned closely together. In an embodiment, the periodic structure layout may be made smaller than the measurement spot (i.e., the periodic structure layout is overfilled). Thus, in an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 µm×20 µm or within 16 µm×16 µm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Returning to FIG. 4, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets +d and −d respectively. While four periodic structures are illustrated, another embodiment may include a larger matrix to obtain desired accuracy. For example, a 3×3 array of nine composite periodic structures may have biases −4d, −3d, −2d, −d, 0, +d, +2d, +3d, +4d. Separate images of these periodic structures can be identified in an image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. The target can be positioned in among device product features, rather than or in addition to in a scribe lane. If the periodic structures are located in device product areas, device features may also be visible in the periphery of this image field. Processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter.

In an embodiment, one of the parameters of interest of a patterning process is feature width (e.g., CD). FIG. 6 depicts a highly schematic example metrology apparatus (e.g., a scatterometer) that can enable feature width determination. It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 6. In general, for the reconstruction the general form of the structure is known and some variables are assumed from knowledge of the process by which the structure was made, leaving only a few variables of the structure to be determined from the measured data. Such a metrology apparatus may be configured as a normal-incidence metrology apparatus or an oblique-incidence metrology apparatus. Moreover, in addition to measurement of a parameter by reconstruction, angle resolved scatterometry is useful in the measurement of asymmetry of features in product and/or resist patterns. A particular application of asymmetry measurement is for the measurement of overlay, where the target comprises one set of periodic features superimposed on another. The concepts of asymmetry measurement in this manner are described, for example, in U.S. patent application publication US2006-066855, which is incorporated herein in its entirety.

Figure 7:
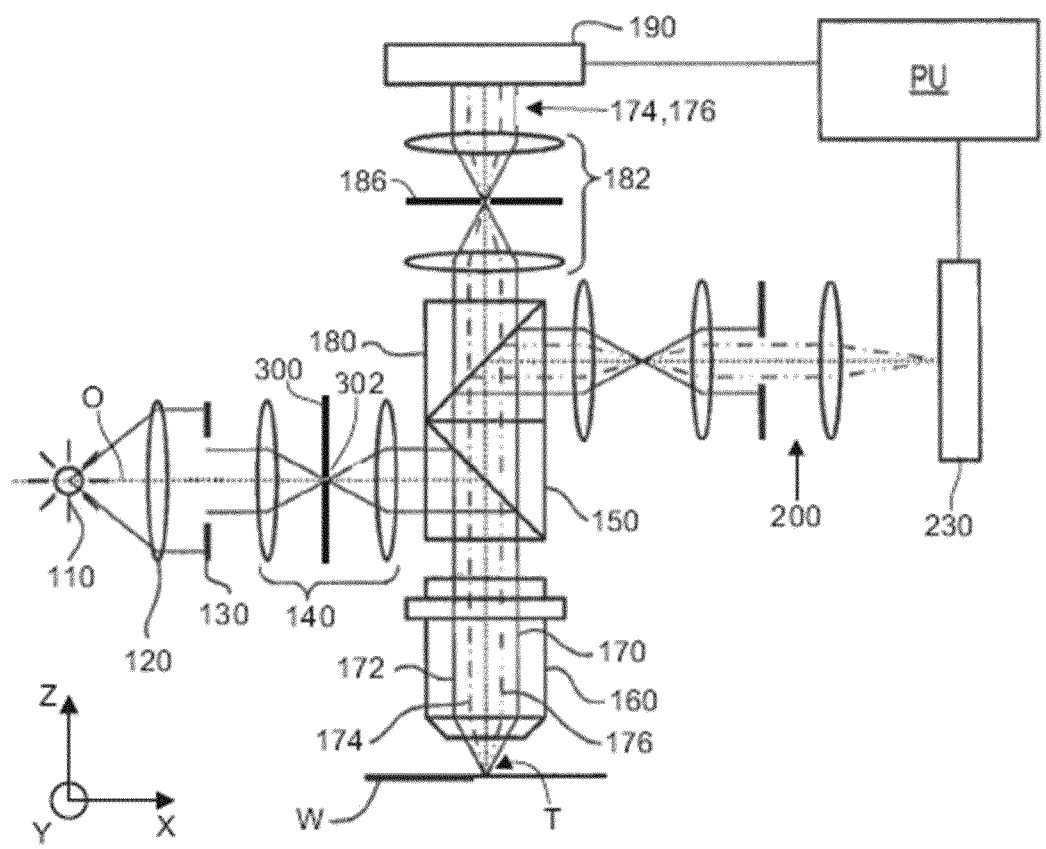
FIG. 7 schematically depicts an example of a metrology apparatus.

FIG. 7 illustrates an example of an alternative metrology apparatus. The principles of operation of this type of metrology apparatus are explained in more detail in the U.S. Patent Application Nos. US 2006-033921 and US 2010-201963, which are incorporated herein in their entireties by reference. An optical axis, which has several branches throughout the apparatus, is represented by a dotted line O. In this apparatus, radiation emitted by source 110 (e.g., a xenon lamp) is directed onto substrate W via by an optical system comprising: lens system 120, aperture plate 130, lens system 140, a partially reflecting surface 150 and objective lens 160. In an embodiment these lens systems 120, 140, 160 are arranged in a double sequence of a 4 F arrangement. In an embodiment, the radiation emitted by radiation source 110 is collimated using lens system 120. A different lens arrangement can be used, if desired. The angular range at which the radiation is incident on the substrate can be selected by defining a spatial intensity distribution in a plane that presents the spatial spectrum of the substrate plane. In particular, this can be done by inserting an aperture plate 130 of suitable form between lenses 120 and 140, in a plane which is a back-projected image of the objective lens pupil plane. Different intensity distributions (e.g., annular, dipole, etc.) are possible by using different apertures. The angular distribution of illumination in radial and peripheral directions, as well as properties such as wavelength, polarization and/or coherency of the radiation, can all be adjusted to obtain desired results. For example, one or more interference filters 130 (see FIG. 9) can be provided between source 110 and partially reflecting surface 150 to select a wavelength of interest in the range of, say, 400-900 nm or even lower, such as 200-300 nm. The interference filter may be tunable rather than comprising a set of different filters. A grating could be used instead of an interference filter. In an embodiment, one or more polarizers 170 (see FIG. 9) can be provided between source 110 and partially reflecting surface 150 to select a polarization of interest. The polarizer may be tunable rather than comprising a set of different polarizers.

As shown in FIG. 7, the target T is placed with substrate W normal to the optical axis O of objective lens 160. Thus, radiation from source 110 is reflected by partially reflecting surface 150 and focused into an illumination spot S (see FIG. 8) on target T on substrate W via objective lens 160. In an embodiment, objective lens 160 has a high numerical aperture (NA), desirably at least 0.9 or at least 0.95. An immersion metrology apparatus (using a relatively high refractive index fluid such as water) may even have a numerical aperture over 1.

Rays of illumination 170, 172 focused to the illumination spot from angles off the axis O gives rise to diffracted rays 174, 176. It should be remembered that these rays are just one of many parallel rays covering an area of the substrate including target T. Each element within the illumination spot is within the field of view of the metrology apparatus. Since the aperture in plate 130 has a finite width (necessary to admit a useful quantity of radiation), the incident rays 170, 172 will in fact occupy a range of angles, and the diffracted rays 174, 176 will be spread out somewhat. According to the point spread function of a small target, each diffraction order will be further spread over a range of angles, not a single ideal ray as shown.

At least the $0^{th}$ order diffracted by the target on substrate W is collected by objective lens 160 and directed back through partially reflecting surface 150. An optical element 180 provides at least part of the diffracted beams to optical system 182 which forms a diffraction spectrum (pupil plane image) of the target T on sensor 190 (e.g. a CCD or CMOS sensor) using the zeroth and/or first order diffractive beams. In an embodiment, an aperture 186 is provided to filter out certain diffraction orders so that a particular diffraction order is provided to the sensor 190. In an embodiment, the aperture 186 allows substantially or primarily only zeroth order radiation to reach the sensor 190. In an embodiment, the sensor 190 may be a two-dimensional detector so that a two-dimensional angular scatter spectrum of a substrate target T can be measured. The sensor 190 may be, for example, an array of CCD or CMOS sensors, and may use an integration time of, for example, 40 milliseconds per frame. The sensor 190 may be used to measure the intensity of redirected radiation at a single wavelength (or narrow wavelength range), the intensity separately at multiple wavelengths or integrated over a wavelength range. Furthermore, the sensor may be used to separately measure the intensity of radiation with transverse magnetic- and/or transverse electric-polarization and/or the phase difference between transverse magnetic- and transverse electric-polarized radiation.

Optionally, optical element 180 provides at least part of the diffracted beams to measurement branch 200 to form an image of the target on the substrate W on a sensor 230 (e.g. a CCD or CMOS sensor). The measurement branch 200 can be used for various auxiliary functions such as focusing the metrology apparatus (i.e., enabling the substrate W to be in focus with the objective 160), and/or for dark field imaging of the type mentioned in the introduction.

In order to provide a customized field of view for different sizes and shapes of grating, an adjustable field stop 300 is provided within the lens system 140 on the path from source 110 to the objective lens 160. The field stop 300 contains an aperture 302 and is located in a plane conjugate with the plane of the target T, so that the illumination spot becomes an image of the aperture 302. The image may be scaled according to a magnification factor, or the aperture and illumination spot may be in 1:1 size relation. In order to make the illumination adaptable to different types of measurement, the aperture plate 300 may comprise a number of aperture patterns formed around a disc, which rotates to bring a desired pattern into place. Alternatively or in addition, a set of plates 300 could be provided and swapped, to achieve the same effect. Additionally or alternatively, a programmable aperture device such as a deformable mirror array or transmissive spatial light modulator can be used also.

Typically, a target will be aligned with its periodic structure features running either parallel to the Y axis or parallel to the X axis. With regard to its diffractive behavior, a periodic structure with features extending in a direction parallel to the Y axis has periodicity in the X direction, while the a periodic structure with features extending in a direction parallel to the X axis has periodicity in the Y direction. In order to measure the performance in both directions, both types of features are generally provided. While for simplicity there will be reference to lines and spaces, the periodic structure need not be formed of lines and space. Moreover, each line and/or space between lines may be a structure formed of smaller sub-structures. Further, the periodic structure may be formed with periodicity in two dimensions at once, for example where the periodic structure comprises posts and/or via holes.

Figure 8:
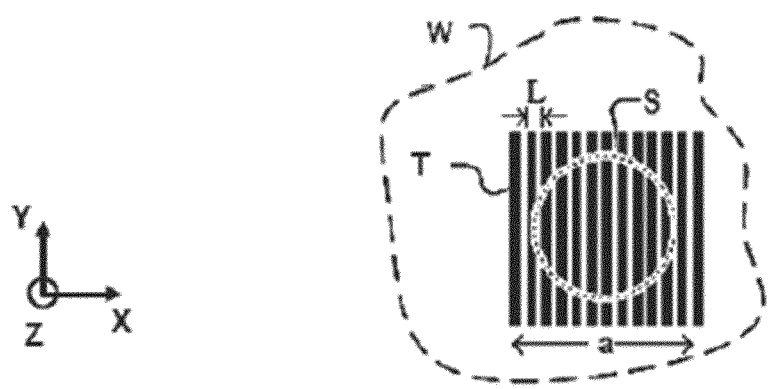
FIG. 8 illustrates the relationship between an illumination spot of a metrology apparatus and a metrology target.

FIG. 8 illustrates a plan view of a typical target T, and the extent of illumination spot S in the apparatus of FIG. 7. To obtain a diffraction spectrum that is free of interference from surrounding structures, the target T, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. This simplifies mathematical reconstruction of the target as it can be regarded as infinite.

Figure 9:
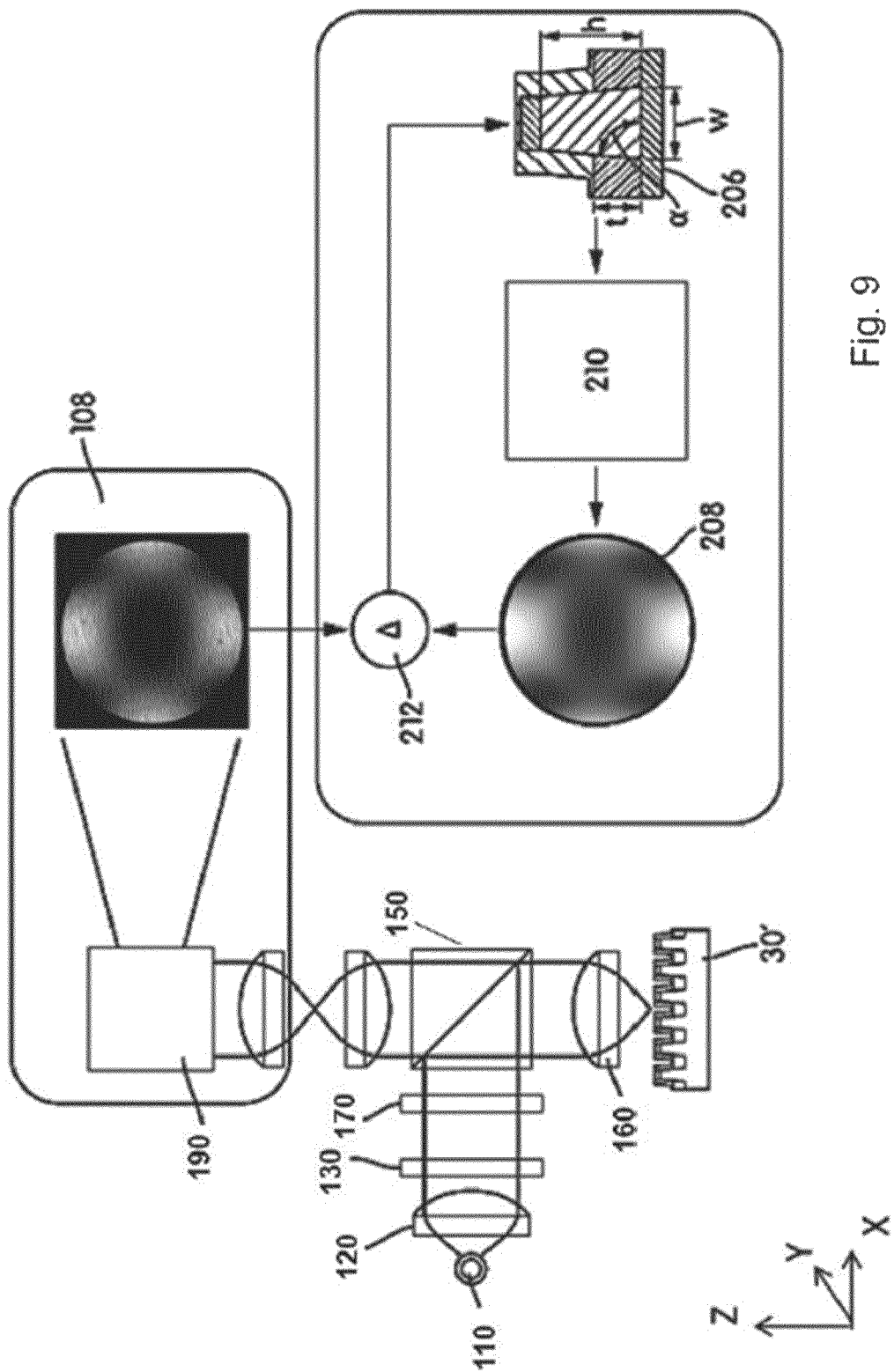
FIG. 9 schematically depicts a process of deriving one or more variables of interest based on measurement data.

FIG. 9 schematically depicts an example process of the determination of the value of one or more variables of interest of a target pattern 30' based on measurement data obtained using metrology. Radiation detected by the detector 190 provides a measured radiation distribution 108 for target 30'.

For the given target 30', a radiation distribution 208 can be computed/simulated from a parameterized mathematical model 206 using, for example, a numerical Maxwell solver 210. The parameterized mathematical model 206 shows example layers of various materials making up, and associated with, the target. The parameterized mathematical model 206 may include one or more of variables for the features and layers of the portion of the target under consideration, which may be varied and derived. As shown in FIG. 9, the one or more of the variables may include the thickness t of one or more layers, a width w (e.g., CD) of one or more features, a height h of one or more features, a sidewall angle α of one or more features, and/or relative position between features (herein considered overlay). Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. One or more values of one or more parameters of a 1-D periodic structure or a 2-D periodic structure, such as a value of width, length, shape or a 3-D profile characteristic, may be input to the reconstruction process from knowledge of the patterning process and/or other measurement processes. For example, the initial values of the variables may be those expected values of one or more parameters, such as a value of CD, pitch, etc., for the target being measured.

In some cases, a target can be divided into a plurality of instances of a unit cell. To help ease computation of the radiation distribution of a target in that case, the model 206 can be designed to compute/simulate using the unit cell of the structure of the target, where the unit cell is repeated as instances across the full target. Thus, the model 206 can compute using one unit cell and copy the results to fit a whole target using appropriate boundary conditions in order to determine the radiation distribution of the target.

Additionally or alternatively to computing the radiation distribution 208 at the time of reconstruction, a plurality of radiation distributions 208 can be pre-computed for a plurality of variations of variables of the target portion under consideration to create a library of radiation distributions for use at the time of reconstruction.

The measured radiation distribution 108 is then compared at 212 to the computed radiation distribution 208 (e.g., computed near that time or obtained from a library) to determine the difference between the two. If there is a difference, the values of one or more of the variables of the parameterized mathematical model 206 may be varied, a new computed radiation distribution 208 obtained (e.g., calculated or obtained from a library) and compared against the measured radiation distribution 108 until there is sufficient match between the measured radiation distribution 108 and the radiation distribution 208. At that point, the values of the variables of the parameterized mathematical model 206 provide a good or best match of the geometry of the actual target 30'. In an embodiment, there is sufficient match when a difference between the measured radiation distribution 108 and the computed radiation distribution 208 is within a tolerance threshold.

In these metrology apparatuses, a substrate support may be provided to hold the substrate W during measurement operations. The substrate support may be similar or identical in form to the substrate table WT of FIG. 1. In an example where the metrology apparatus is integrated with the lithographic apparatus, it may even be the same substrate table. Coarse and fine positioners may be provided to accurately position the substrate in relation to a measurement optical system. Various sensors and actuators are provided for example to acquire the position of a target of interest, and to bring it into position under the objective lens. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

In an embodiment, the measurement accuracy and/or sensitivity of a target may vary with respect to one or more attributes of the beam of radiation provided onto the target, for example, the wavelength of the radiation beam, the polarization of the radiation beam, the intensity distribution (i.e., angular or spatial intensity distribution) of the radiation beam, etc. Thus, a particular measurement strategy can be selected that desirably obtains, e.g., good measurement accuracy and/or sensitivity of the target.

In order to monitor the patterning process (e.g., a device manufacturing process) that includes at least one pattern transfer step (e.g., an optical lithography step), the patterned substrate is inspected and one or more parameters of the patterned substrate are measured/determined. The one or more parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, placement error (e.g., edge placement error), etc. This measurement may be performed on a target of the product substrate itself and/or on a dedicated metrology target provided on the substrate. The measurement can be performed after-development of a resist but before etching or can be performed after-etch.

In an embodiment, a parameter obtained from a measurement process is a parameter derived from a parameter determined directly from the measurement process. As an example, a derived parameter obtained from a measurement parameter is edge placement error for the patterning process. The edge placement error provides a variation in the location of an edge of a structure created by the patterning process. In an embodiment, the edge placement error is derived from an overlay value. In an embodiment, the edge placement error is derived from a combination of an overlay value and CD value. In an embodiment, the edge placement is derived from a combination of an overlay value, a CD value and a value corresponding to a local variation (e.g., edge roughness, shape asymmetry, etc. of the individual structures). In an embodiment, the edge placement error comprises an extreme value (e.g., 3 standard deviation, i.e., 3σ) of overlay and CD errors combined. In an embodiment, in a multi-patterning process involving creating structures and involving "cutting" structures by removing a portion of structure through etching of a pattern provided by the patterning process in relation to the structure, the edge placement error has the following form (or comprises one or more of the following terms):

$$\sqrt{(3\sigma_{overlay})^2 + \left(\frac{3\sigma_{CDU\,structures}}{2}\right)^2 + \left(\frac{3\sigma_{CDU\,cuts}}{2}\right)^2 + \frac{3\sigma_{OPE,PBA}}{2} + 6\sigma_{LER,LPE}},$$

wherein σ is standard deviation, $\sigma_{overlay}$ corresponds to the standard deviation of overlay, $\sigma_{CDU\,structures}$ corresponds to the standard deviation of the critical dimension uniformity (CDU) of structures created in the patterning process, $\sigma_{CDU\,cuts}$ corresponds to the standard deviation of the critical dimension uniformity (CDU) of cuts, if any, created in the patterning process, $\sigma_{OPE,PBA}$ corresponds to the standard deviation of optical proximity effects (OPE) and/or proximity bias average (PBA) which is a difference between CD at pitch to a reference CD, and $\sigma_{LER,LPE}$ corresponds to the standard deviation of line edge roughness (LER) and/or local placement error (LPE). While formulation above is in relation standard deviation, it can be formulated in a different comparable statistical manner, such as variance.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1st orders in the diffraction spectrum of a periodic grating). This can be done as described above and as described, for example, in U.S. patent application publication US2006-066855, which is incorporated herein in its entirety by reference. Another application of diffraction-based metrology is in the measurement of feature width (CD) within a target. Such techniques can use the apparatus and methods described above in respect of FIGS. 6-9.

Now, while these techniques are effective, it is desirable to provide an alternative measurement technique that derives feature asymmetry within a target (such as overlay, CD asymmetry, sidewall angle asymmetry, etc.). This technique can be effective for specially designed metrology targets or perhaps more significantly, for determining feature asymmetry directly on a device pattern.

Figures 10A, 10B:
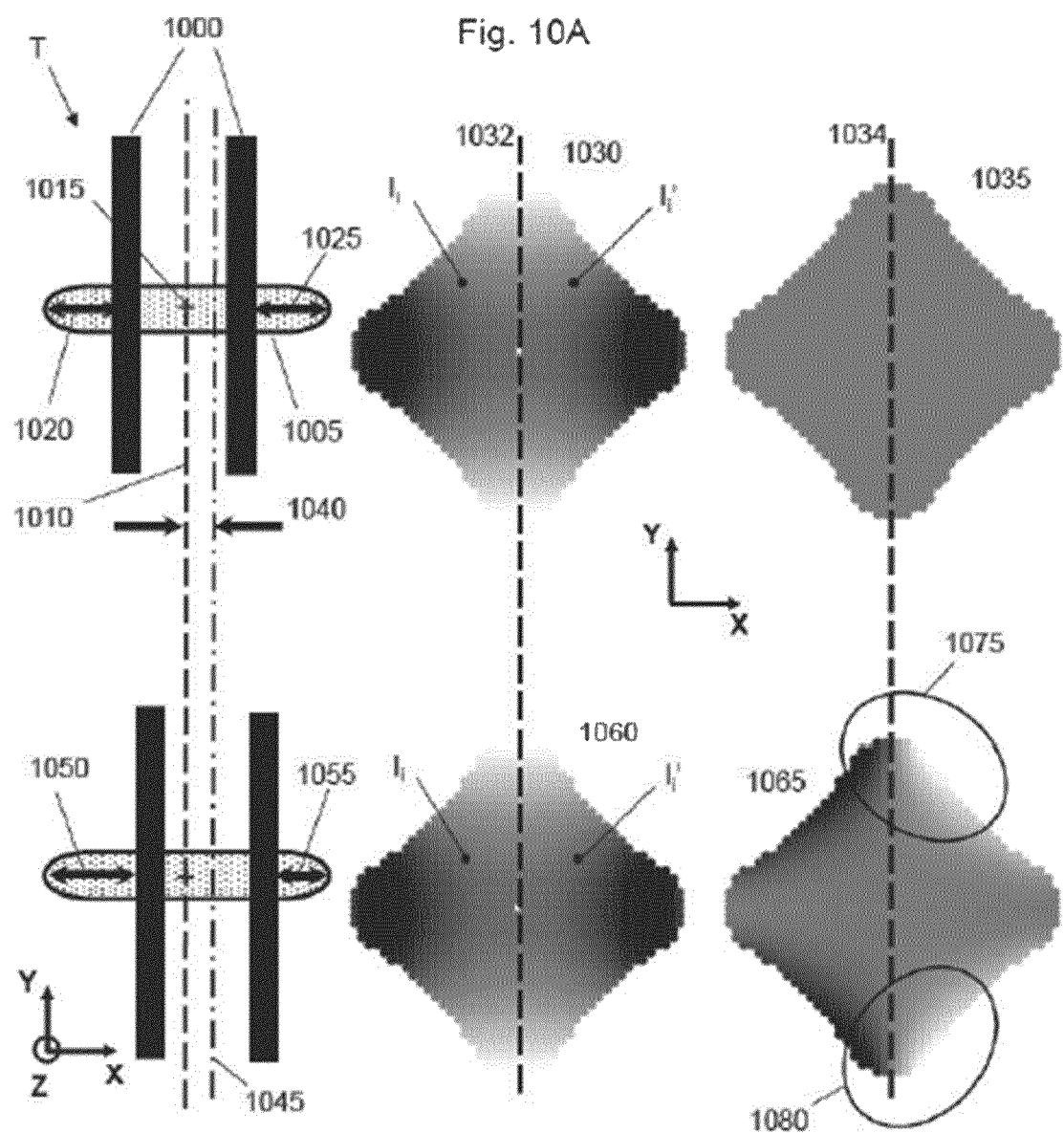
FIG. 10A schematically depicts an example unit cell, an associated pupil representation, and an associated derived pupil representation.
FIG. 10B schematically depicts an example unit cell, an associated pupil representation, and an associated derived pupil representation.
Figure 10C:
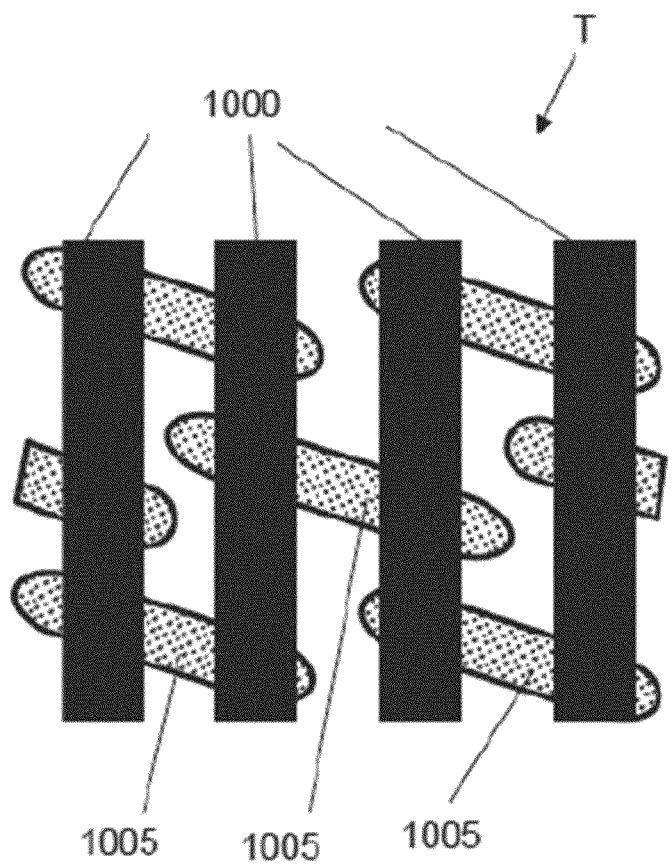
FIG. 10C schematically depicts an example target comprising one or more physical instances of a unit cell.

Referring to FIG. 10, principles of this measurement technique are described in the context of an overlay embodiment. In FIG. 10A, a geometrically symmetric unit cell of a target T is shown. The target T can comprise just a single physical instance of a unit cell or can comprise a plurality of physical instances of the unit cell as shown in FIG. 10C.

The target T can be a specially designed target. In an embodiment, the target is for a scribe lane. In an embodiment, the target can be an in-die target, i.e., the target is among the device pattern (and thus between the scribe lanes). In an embodiment, the target can have a feature width or pitch comparable to device pattern features. For example, the target feature width or pitches can be less than or equal to 300% of the smallest feature size or pitch of the device pattern, be less than or equal to 200% of the smallest feature size or pitch of the device pattern, be less than or equal to 150% of the smallest feature size or pitch of the device pattern, or be less than or equal to 100% of the smallest feature size or pitch of the device pattern.

The target T can be a device structure. For example, the target T can be a portion of a memory device (which often has one or more structures that are, or can be, geometrically symmetric as discussed further below).

In an embodiment, the target T or a physical instance of the unit cell can have an area of less than or equal to 2400 square microns, an area of less than or equal to 2000 square microns, an area of less than or equal to 1500 square microns, an area of less than or equal to 1000 square microns, an area of less than or equal to 400 square microns, less than or equal to 200 square microns, less than or equal to 100 square microns, less than or equal to 50 square microns, less than or equal to 25 square microns, less than or equal to 10 square microns, less than or equal to 5 square microns, less than or equal to 1 square micron, less than or equal to 0.5 square microns, or less than or equal to 0.1 square microns. In an embodiment, the target T or a physical instance of the unit cell has a cross-sectional dimension parallel to the plane of the substrate of less than or equal to 50 microns, less than or equal to 30 microns, less than or equal to 20 microns, less than or equal to 15 microns, less than or equal to 10 microns, less than or equal to 5 microns, less than or equal to 3 microns, less than or equal to 1 micron, less than or equal to 0.5 microns, less than or equal to 0.2 microns, or less than or equal to 0.1 microns.

In an embodiment, the target T or a physical instance of the unit cell has a pitch of structures of less than or equal to less than or equal to 5 microns, less than or equal to 2 microns, less than or equal to 1 micron, less than or equal to 500 nm, less than or equal to 400 nm, less than or equal to 300 nm, less than or equal to 200 nm, less than or equal to 150 nm, less than or equal to 100 nm, less than or equal to 75 nm, less than or equal to 50 nm, less than or equal to 32 nm, less than or equal to 22 nm, less than or equal to 16 nm, less than or equal to 10 nm, less than or equal to 7 nm or less than or equal to 5 nm.

In an embodiment, the target T has a plurality of physical instances of the unit cell. Thus, a target T could typically have the higher dimensions listed here, while the physical instances of the unit cell will have the lower dimensions listed here. In an embodiment, the target T comprises 50,000 or more physical instances of the unit cell, 25,000 or more physical instances of the unit cell, 15,000 or more physical instances of the unit cell, 10,000 or more physical instances of the unit cell, 5,000 or more physical instances of the unit cell, 1000 or more physical instances of the unit cell, 500 or more physical instances of the unit cell, 200 or more physical instances of the unit cell, 100 or more physical instances of the unit cell, 50 or more physical instances of the unit cell, or 10 or more physical instances of the unit cell.

Desirably, the physical instance of the unit cell or the plurality of physical instances of the unit cell collectively fills a beam spot of the metrology apparatus. In that case, the measured results comprise essentially only information from the physical instance of the unit cell (or its plurality of instances). In an embodiment, the beam spot has a cross-sectional width of 50 microns or less, 40 microns or less, 30 microns or less, 20 microns or less, 15 microns or less, 10 microns or less, 5 microns or less, or 2 microns or less.

The unit cell in FIG. 10A comprises at least two structures that are, or will be, physically instantiated on the substrate. A first structure 1000 comprises lines and a second structure 1005 comprises an oval-type shape. Of course, the first and second structures 1000, 1005 can be different structures than depicted.

Further, in this example, there can be a relative shift between the first and second structures 1000, 1005 from their expected position due to their separate transfer onto the substrate so as to have an error in overlay. In this example, the first structure 1000 is located in a higher layer on a substrate than the second structure 1005. Thus, in an embodiment, the second structure 1005 can be produced in a first lower layer in a first execution of a patterning process and the first structure 1000 can be produced in a second higher layer than the first lower layer in a second execution of the patterning process. Now, it is not necessary that the first and second structures 1000, 1005 be located in different layers. For example, in a double patterning process (including, for example, an etching process as part thereof), the first and second structures 1000, 1005 could be produced in a same layer to form essentially a single pattern but there could still be an "overlay" concern in terms of their relative placement within the same layer. In this single layer example, both the first and second structures 1000, 1005 could have, for example, the form of lines like shown in FIG. 10A for the first structure 1000 but the lines of the second structure 1005, already provided on the substrate by a first pattern transfer process, could be interleaved with the lines of the structure 1000 provided in a second pattern transfer process.

Significantly, the unit cell has, or is capable of having, a geometric symmetry with respect to an axis or point. For example, the unit cell in FIG. 10A has reflection symmetry with respect to, for example, axis 1010 and point/rotational symmetry with respect to, for example, point 1015. Similarly, it can be seen that a physical instance of the unit cell (and thus a combination of physical instances of the unit cell) in FIG. 10C has a geometric symmetry.

In an embodiment, the unit cell has a geometric symmetry for a certain feature (such as overlay). Embodiments herein focus on the unit cell having zero overlay when it is geometrically symmetric. However, instead, the unit cell can have zero overlay for a certain geometric asymmetry. Appropriate offsets and calculations would then be used to account for the unit cell having a zero overlay when it has a certain geometric asymmetry. Pertinently, the unit cell should be capable of change in symmetry (e.g., become asymmetry, or become further asymmetric, or become symmetric from an asymmetric situation) depending on the certain feature value.

In the example of FIG. 10A, the unit cell has a geometric symmetry for a zero overlay (although it need not be zero overlay). This is represented by the arrows 1020 and 1025 which shows that the lines of the first structure 1000 are evenly aligned with respect to the oval-type shape of the second structure 1005 (and which even alignment at least in part enables the unit cell to have geometric symmetry as shown in FIG. 10A). So, in this example, when the unit cell has geometric symmetry, there is zero overlay. However, when there is an error in overlay (e.g., a non-zero overlay), the unit cell is no longer geometrically symmetric and by definition the target is no longer geometrically symmetric.

Further, where a target comprises a plurality of physical instances of the unit, the instances of the unit cell are arranged periodically. In an embodiment, the instances of the unit cell are arranged in a lattice. In an embodiment, the periodic arrangement has a geometric symmetry within the target.

So, in this technique, as discussed further hereafter, advantage is taken of the change in geometric symmetry (e.g., a change to a geometric asymmetry, or change to a further geometric asymmetry, or a change from geometric asymmetry to geometric symmetry) related to a feature asymmetry of interest (e.g., non-zero overlay) to be able to determine the feature asymmetry (e.g., non-zero overlay).

A target comprising a physical instance of the unit cell of FIG. 10A can be illuminated with radiation using, for example, the metrology apparatus of FIG. 7. The radiation redirected by the target can be measured, e.g., by detector 190. In an embodiment, a pupil of the redirected radiation is measured, i.e., a Fourier transform plane. An example measurement of such a pupil is depicted as pupil image 1030. While the pupil image 1030 has a diamond-type shape, it need not have such a shape. The term pupil and pupil plane herein includes any conjugates thereof unless the context otherwise requires (for example, where a pupil plane of a particular optical system is being identified). The pupil image 1030 is effectively an image, specified in terms of an optical characteristic (in this case intensity), of a pupil of the redirected radiation.

For convenience, the discussion herein will focus on intensity as an optical characteristic of interest. But, the techniques herein may be used with one or more alternative or additional optical characteristics, such as phase and/or reflectivity.

Further, for convenience, the discussion herein focuses on detecting and processing images of redirected radiation and in particular pupil images. However, the optical properties of the redirected radiation can be measured and represented in different manners than images. For example, the redirected radiation can be processed in terms of one or more spectrums (e.g., intensity as a function of wavelength). Thus, a detected image of redirected radiation can be considered as an example of an optical representation of the redirected radiation. So, in the case of a pupil plane image, a pupil image is an example of a pupil representation.

Further, the redirected radiation can be polarized or non-polarized. In an embodiment, the measurement beam radiation is polarized radiation. In an embodiment, the measurement beam radiation is linearly polarized.

In an embodiment, a pupil representation is of primarily, or substantially, one diffraction order of redirected radiation from the target. For example, the radiation can be 80% or more, 85% or more, 90% or more, 95% or more, 98% or more or 99% or more, of a particular order of the radiation. In an embodiment, the pupil representation is of primarily, or substantially, zeroth order redirected radiation. This can occur, for example, when the pitch of the target, the wavelength of the measurement radiation, and optionally one or more other conditions cause the target to redirect primarily zeroth order (although there can be radiation of one or more higher orders). In an embodiment, a majority of the pupil representation is zeroth order redirected radiation. In an embodiment, the pupil representation is of zeroth radiation and separately of $1^{st}$ order radiation, which can then be linearly combined (superposition). The aperture 186 in FIG. 7 can be used to select a particular order, e.g., the zeroth order, of radiation.

Having regard to pupil image 1030 corresponding to the geometrically symmetric unit cell of the first and second structures 1000, 1005, it can be seen that the intensity distribution is essentially symmetric within the pupil image (e.g., with the same symmetry type as of the geometric structure). This is further confirmed by removing the symmetric intensity distribution portion from the pupil image 1030, which results in the derived pupil image 1035. To remove the symmetric intensity distribution portion, a particular pupil image pixel (e.g., a pixel) can have the symmetric intensity distribution portion removed by subtracting from the intensity at that particular pupil image pixel the intensity of a symmetrically located pupil image pixel, and vice versa. In an embodiment, the pixel can correspond to the pixels of the detector (e.g., detector 190), but it need not; for example, a pupil image pixel could be a plurality of the pixels of the detector. In an embodiment, the point or axis of symmetry across which pixel intensities are subtracted corresponds with a point or axis of symmetry of the unit cell. So, for example, considering pupil image 1030, the symmetry intensity distribution portion can be removed by, for example, subtracting from the intensity $I_i$ at that particular pixel shown the intensity $I_i'$ from a symmetrically located pixel, i.e., symmetrically located with respect to axis 1032. Thus, the intensity at a particular pixel with the symmetrical intensity portion removed, $S_i$, is then $S_i=I_i-I_i'$. This can be repeated for a plurality of pixels of the pupil image, e.g., all the pixels in the pupil image. As seen in the derived pupil image 1035, the intensity distribution corresponding to the symmetric unit cell is essentially completely symmetric. Thus, a symmetric target with a symmetric unit cell geometry (and if applicable, a certain periodicity of instances of the unit cell) results in a symmetric pupil response as measured by a metrology apparatus.

Referring now to FIG. 10B, an example of an error in overlay is depicted with respect to the unit cell depicted in FIG. 10A. In this case, the first structure 1000 is shifted in the X-direction with respect to the second structure 1005. In particular, the axis 1010 centered on the lines of the first structure 1000 has shifted to the right in FIG. 10B to axis 1045. Thus, there is an error in the overlay 1040 in the X-direction; that is, an X direction overlay error. Of course, the second structure 1005 could be shifted relative to the first structure 1000 or both could be shifted relative to each other. In any event, the result is an X direction overlay error. However, as should be appreciated from this unit cell arrangement, a purely relative shift in the Y-direction between the first structure 1000 and the second structure 1005 would not change the geometric symmetry of this unit cell. But, with an appropriate geometric arrangement, overlay in two directions or between different combinations of parts of the unit cell can change symmetry and could also be determined, as further discussed below.

As a consequence of the change in the physical configuration of the unit cell from the nominal physical configuration of the unit cell in FIG. 10A and represented by the error in overlay 1040, the result is that the unit cell has become geometrically asymmetric. This can be seen by the arrows 1050 and 1055 of different length, which show that the oval-type shape of the second structure 1005 is unevenly located relative to the lines of the first structure 1000. The symmetry is examined with respect to the point or axis of symmetry of the pupil image 1030, i.e. in that case, axis 1032 which is now shown axis 1034.

The physical instance of the unit cell of FIG. 10B can be illuminated with radiation using, for example, the metrology apparatus of FIG. 7. A pupil image of the redirected radiation can be recorded, e.g., by detector 190. An example of such a pupil image is depicted as pupil image 1060. The pupil image 1060 is effectively an image of the intensity. While the pupil image 1060 has a diamond-type shape, it need not have such a shape; it can be a circular shape or any other shape. Moreover, the pupil image 1060 is of a substantially same axis or coordinate location as pupil image 1030. That is, in this embodiment, an axis of symmetry 1010 in the unit cell of FIG. 10A and the same axis in the unit cell of FIG. 10B align with an axis of symmetry 1032 of the pupil images 1030, 1060.

Having regard to pupil image 1060 corresponding to the geometrically asymmetric unit cell of the first and second structures 1000, 1005, it visually seems like the intensity distribution is essentially symmetric within the pupil image. However, there is an asymmetric intensity distribution portion within the pupil image. This asymmetric intensity distribution portion is due to the asymmetry in the unit cell. Moreover, the asymmetric intensity distribution is significantly lower in magnitude than a symmetric intensity distribution portion in the pupil image.

So, in an embodiment, to more effectively isolate the asymmetric intensity distribution portion, the symmetric intensity distribution portion can be removed from the pupil image 1060, which results in the derived pupil image 1065. Like with obtaining derived pupil image 1035, a particular pupil image pixel (e.g., a pixel) can have the symmetric intensity distribution portion removed by subtracting from the intensity at that particular pupil image pixel the intensity of a symmetrically located pupil image pixel, and vice versa, as discussed above. So, for example, considering pupil image 1060, the symmetry intensity distribution portion can be removed by, for example, subtracting from the intensity $I_i$ at that particular pixel shown the intensity $I_i'$ from a symmetrically located pixel, i.e., symmetrically located with respect to axis 1032 to yield $S_i$. This can be repeated for a plurality of pixels of the pupil image, e.g., all the pixels in the pupil image. In FIGS. 10A and 10B, the full derived pupil images of $S_i$ are depicted for explanation purposes. As will be appreciated, half of a derived pupil image of FIG. 10A or 10B is the same as the other half thereof. So, in an embodiment, the values from only half of the pupil image can be used for further processing discussed herein and so a derived image pupil used in further processing herein can be only half of the $S_i$ values for a pupil.

As seen in the derived pupil image 1065, the intensity distribution measured using a physical instance of an asymmetric unit cell is not symmetric. As seen in regions 1075 and 1080, there is an asymmetric intensity distribution portion visible once the symmetric intensity distribution portion is removed. As noted above, the full derived pupil image 1065 is shown and so the asymmetric intensity distribution portion is shown on both halves (even though they are equal to each other in terms of magnitude and distribution in their respective halves).

Thus, an asymmetry in the geometrical domain corresponds to an asymmetry in the pupil. So, in an embodiment, a method is provided that uses the optical response of a periodic target that possesses, or is capable of, inherent geometric symmetry in its physical instance of a unit cell to determine a parameter corresponding to a physical configuration change that causes a change in geometric symmetry (e.g., cause an asymmetry, or cause a further asymmetry, or cause an asymmetric unit cell to become symmetric) of the physical instance of the unit cell. In particular, in an embodiment, an overlay induced asymmetry (or lack thereof) in the pupil as measured by a metrology apparatus can be exploited to determine the overlay. That is, the pupil asymmetry is used to measure the overlay within the physical instance of the unit cell and thus within the target.

An asymmetry in the geometrical domain may also be caused by a tilt in an etching path through a target layer in a target, the tilt being induced by errors in an etching process used to form a pattern in the target layer and/or stresses in the target layer and/or surrounding layers. The asymmetry will cause a corresponding asymmetry in the pupil (or in another detected representation of scattered radiation) which can be used to measure the tilt. Furthermore, the asymmetry in the pupil caused by tilt is different from the asymmetry caused by overlay, making it possible to extract tilt independently of overlay and to extract overlay independently of tilt. The measured tilt can be used to control an etching process and/or other patterning processes, as will be described in further detail below.

As depicted in FIG. 2, in an embodiment an etch controller 223 is provided for controlling at etching process performed by etching station 222. The control of the etching process may comprise controlling one or more of the following etch parameters: a desired thermal pattern across a substrate, a desired chemical concentration pattern in plasma used in the etching process, a desired electric field pattern surrounding a substrate during the etching process, a voltage applied to one more electrodes during the etching process. Each of these etch parameters can be varied so as to vary in a positionally dependent way an etch direction and/or an etch rate and/or another etch factor. By varying at least one of the etch parameters it is possible to optimize the etch process to reduce or eliminate errors introduced by the etching process, such as errors caused by tilted etching paths.

FIG. 11 illustrates how errors may be introduced by the etching process. FIG. 11 illustrates specifically how overlay errors can be introduced at the edge of a substrate. However, an etch process could introduce errors over the whole of the substrate or in areas other than or in addition to edge areas of the substrate. Overlay errors may be introduced by the etching process in an asymmetrical way.

As illustrated at the top left hand side of FIG. 11, a substrate 220 typically includes a lower layer 310 with a pattern embedded in it. On top of the lower layer 310 one or more device layers 320 are applied. One or more further layers 330 may be applied, before a photoresist layer 340 is applied on which a pattern is irradiated by the apparatus 200 and developed into a physical resist pattern by the developing apparatus 212. As illustrated there is no overlay error between the physical resist pattern and the pattern in the lower layer 310.

In the etching station 222 chemicals, for example a plasma, etch the device layers 320 and any further layers 330 in the gaps in the physical resist pattern of the photoresist layer 340. As illustrated in the top center of FIG. 11, if an etch direction as illustrated by arrows 350 is not perfectly perpendicular to the top surface of the substrate 220 the layers 320, 330 are not etched as rectangles but are etched as parallelograms. The parallelograms correspond positionally at their upper end to the physical resist pattern, but even though there is no overlay error between the physical resist pattern and the pattern in the lower layer 310, the parallelogram does not match up positionally with the pattern of the lower layer 310 at the lower end. Thus, when the layers 330, 340 are removed (by further apparatus 226) to arrive at the final substrate 234 or a substrate 232 for the application of further layers, an overlay error is introduced between the pattern in the lower layer 310 and the pattern etched in the device layers 320, as illustrated in the right hand diagram of FIG. 11.

The overlay illustrated on the right hand side of FIG. 11 is therefore an etching station 222 induced overlay error which would not be present if the etch direction 350 were perfectly perpendicular to the top surface of the substrate 220. The central lower diagram in FIG. 11 illustrates how an imperfect etch direction 350 might be induced. For example at the edge of a substrate 220 an electric field 360 used during the etching process might vary from perfectly perpendicular at the surface of the substrate 220 (which it is at the center of the substrate 220) to being angled relative to the perpendicular direction to the top surface of the substrate 220 at the edge of the substrate 220.

One etch parameter which might be varied to change the direction of the electric field (and so the etch direction 350) is a voltage which can be applied to an electrode surrounding the outer edge of the substrate 220. This is an example of an etch parameter which can be varied to vary the etching process (i.e. etch direction 350 at the outer edge of the substrate 220) to reduce error induced by the etching process. Similar concepts are disclosed for example in U.S. Pat. No. 6,767,844 which relates to a temperature controlled focus ring surrounding the substrate during etching and US 2006/0016561 which discloses an edge ring member for achieving a uniform etch rate on the entire surface of the substrate.

Other reasons for an etch induced overlay error might include local variations in concentration of chemical etching agent over the surface of the substrate 220 during etching, thermal patterns present in the substrate 220 during etching etc. Variations in etch direction over the surface of the substrate 220 can be reduced or eliminated by varying etch parameters.

Embodiments of the present disclosure provide ways for reducing or compensating for etch induced errors such as overlay error.

Figure 12:
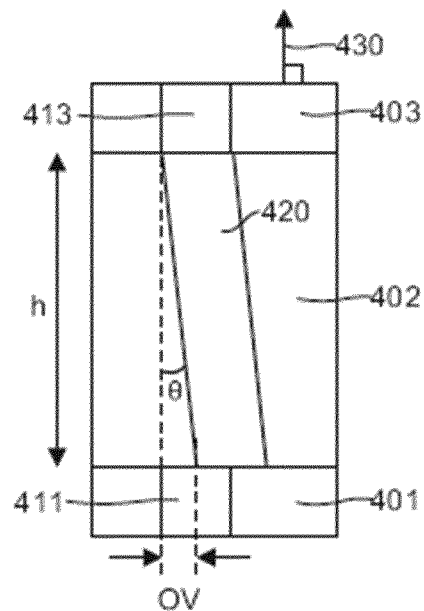
FIG. 12 depicts tilt of a etching path through a target layer.

According to an embodiment, there is provided a method of controlling a patterning process. The method is applied to situations such as that depicted schematically in FIG. 12, which is a simplified version of the configuration depicted in FIG. 11. FIG. 12 is a side sectional view of a small region of a three layer structure comprising a lower layer 401, a target layer 402, and an upper layer 403. Each of the lower layer 401, target layer 402 and upper layer 403 are depicted as single, uniform layers for simplicity, but could in practice each comprise one or multiple layers. The lower layer 401 comprises a lower reference feature 411, which is part of a pattern formed in the lower layer 401. The upper layer 403 comprises an upper reference feature 413, which is part of a pattern formed in the upper layer 403. The target layer 402 also comprises a pattern. A feature in this pattern is tilted due to etching effects such as those discussed above with reference to FIG. 11. The tilted feature defines a path followed by an etching step used to created the pattern in the target layer 402 and is referred to as an etching path 420. The etching path 420 connects the lower reference feature 411 to the upper reference feature 413. The etching path 420 may define a final product feature, such as a via providing an electrical connection between the lower reference feature 411 and the upper reference feature 413. A tilt θ in the etching path 420 caused by an error in the etching process results in the connection between the lower reference feature 411 and the upper reference 413 being imperfect. In effect, the tilt θ causes an overlay error, OV, of h×tan θ at the interface between the lower layer 401 and the target layer 402. The tilt θ is a deviation in a direction of the etching path 420 from a perpendicular 430 to the plane of the target layer 402 (the vertical direction in the orientation of FIG. 12).

The method comprises obtaining tilt data resulting from a measurement of tilt in the etching path 420 through the target layer 402. In an embodiment, the method comprises performing the measurement of tilt. In an embodiment, the measurement of tilt is a direct measurement of tilt. Alternatively or additionally, the measurement of tilt is a non-destructive measurement of tilt. The tilt data is used to control a patterning process. The controlled patterning process is used to form a pattern in a further layer, formed after (i.e. at a later time than) the target layer 402. Various options are available for the control. The choice of control may depend on how quickly the measured tilt varies as a function of position over the substrate. Different methods of control will have different capabilities in terms of their spatial resolution. For simplicity, the following discussion makes reference to a single etching path and a corresponding single tilt of the etching path. In practical applications there will be many etching paths and, potentially, many different tilts associated with them. The method is capable of measuring tilt at multiple positions. The method may, for example, provide a map or fingerprint of measured tilt showing variation across a die or multiple dies.

A particularly efficient way of performing the measurement of tilt is by using the asymmetry in the detected pupil representation (or other detected representation of scattered radiation), as discussed above with reference to FIGS. 10A-10C. Thus, the measurement of tilt may comprise illuminating a structure with radiation and detecting radiation redirected (scattered) by the structure. The detected radiation may comprise primarily zeroth order radiation. The method discussed above with reference to FIGS. 10A-10C allows asymmetry information, such as tilt information or overlay information, to be derived from zeroth order radiation. The use of zeroth order radiation allows measurements to be made on structures with small characteristic length scales or periodicities, thereby making it possible to measure tilt in device structures or in non-device structures located within a substrate die comprising device structures (i.e. non-device structures having characteristic length scales or periodicities that are of the same order of size as device structures). In an embodiment, the tilt is extracted from an asymmetric component of a detected representation of radiation redirected by the structure, such as a detected pupil representation, for example an asymmetry in an intensity distribution in a pupil image. The asymmetry may be with respect to a plane of mirror symmetry. The asymmetry is correlated with the tilt and thereby allows the tilt to be extracted. The approach also allows thicknesses of layers to be extracted at the same time as tilt and/or overlay. The thickness of layers may be required in order to determine the size of a correction to be applied to a subsequently formed layer to correct for a measured tilt.

In one class of embodiment, the measured tilt is used to control a patterning process used to form a pattern in a layer that is formed after the target layer 402 in which the tilt has been measured but on the same instance of the structure. This scenario is depicted schematically in FIG. 13. In this example, a patterning process is adjusted (controlled) to shift the pattern in the upper layer 403 to the left relative to the pattern in the lower layer 401. This shift is an example of control that changes a nominal overlay between patterns produced in different layers. This type of control may be implemented for example by controlling a lithographic pattern transfer step. The result of the control is that the tilted etching path 420, which is shifted to the left as a result of the shift of the reference feature 413, is better aligned with the lower reference feature 411.

Figure 14:
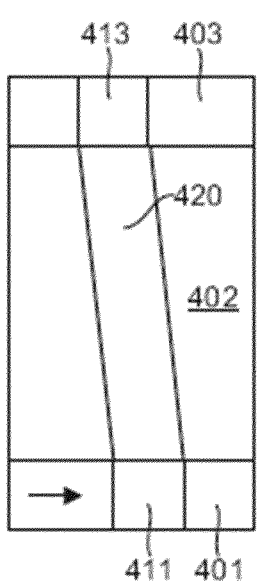
FIG. 14 depicts compensation of the tilt of FIG. 12 by shifting a lower layer.
Figure 15:
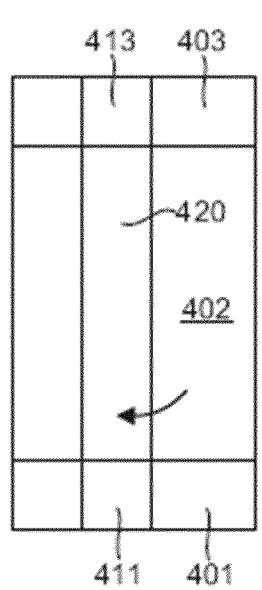
FIG. 15 depicts removal of the tilt of FIG. 12 by controlling an etching process or stress distribution in the target layer or surrounding layers.

In an alternative class of embodiments, the measured tilt is used to control a patterning process used to form a pattern in a layer in or on a subsequently formed instance of the structure (e.g. on a different substrate or wafer). FIGS. 14 and 15 depict examples of such control.

In the example of FIG. 14, a patterning process is adjusted (controlled) to shift a pattern in the lower layer 401 to the right relative to the upper layer 403. This shift is a further example of control that changes a nominal overlay between patterns produced in different layers (in this case the lower layer 401 and the upper layer 403). The result of the control is that the tilted etching path 420 is better aligned with the lower reference feature 411.

Figure 13:
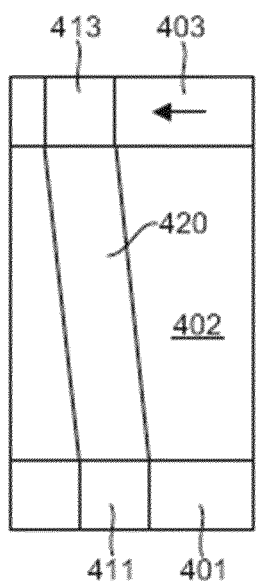
FIG. 13 depicts compensation of the tilt of FIG. 12 by shifting an upper layer.

The patterning process being controlled may thus comprise a lithographic pattern transfer step. The lithographic pattern transfer step may use a patterning device MA to impart a radiation beam with a pattern in its cross-section to define a pattern to be transferred to a substrate, as described above with reference to FIG. 1 for example. In embodiments of this type, the measured tilt θ is used to control the lithographic pattern transfer step. The control may be applied during formation of a pattern in a layer 303 formed after the target layer on the structure (as depicted in FIG. 13). Alternatively or additionally, when the lithographic pattern transfer step is applied to a subsequently formed instance of the structure, the control may be applied during formation of a pattern in a layer 401 formed before the target layer 402 of the subsequently formed instance of the structure or during formation of a pattern in a layer 403 formed after the target layer 402 of the subsequently formed instance of the structure.

In an embodiment, the control of the lithographic pattern transfer step comprises modifying the patterning device MA. The patterning device MA can be modified without recreating an entirely new patterning device MA. In an embodiment, the modification is implemented by selectively heating the patterning device MA to induce localized stresses within the patterning device MA. Further details about how a patterning device MA can be modified are provided in WO 2017/067765A1, which is hereby incorporated in its entirely by reference. The patterning device MA can be modified to correct for measured tilts that vary rapidly as a function of position within a die (i.e. tilt variations of relatively high spatial frequency).

As mentioned above, the control of the lithographic pattern transfer step may comprise changing a nominal overlay between a pattern formed in a layer by the lithographic pattern transfer step and a pattern in a different layer. When the control is implemented by modifying the patterning device MA, the change in nominal overlay may be made to vary as a function of position across the substrate, including within a die, to follow a variation as a function of position of the measured tilt. Alternatively or additionally, all of, or a contribution to, the change in nominal overlay may be applied uniformly for each die or even over the entire substrate. Techniques for modifying a lithographic pattern transfer step to apply a uniform shift in overlay are well known in the art. Applying a uniform shift in overlay to correct for measured tilts may be effective for correcting contributions to tilt that vary relatively slowly with position over the substrate. The applied uniform shift in overlay may be different from one die to the next die, so that each die is subjected to the optimal overlay shift for that die.

Alternatively or additionally, the control of the lithographic pattern transfer step comprises modifying one or more of the following: a dose applied by the radiation beam, a focus of the radiation beam, one or more optical aberrations applied to the radiation beam. For example, modification of dose may be used to make selected features larger to increase the likelihood of reliable electrical connections being made between different layers of the device in the presence of tilted etching paths.

In other embodiments, the patterning process to be controlled comprises a deposition step in which a layer of material is deposited. The deposition may be implemented for example using the coating apparatus 208 described above with reference to FIG. 2. The control of the patterning process may thus comprise control of the coating apparatus 208. In an embodiment, the measured tilt is used to control the deposition step during formation of a layer 403 formed after the target layer 402 on the structure. Alternatively or additionally, when the deposition step is applied to a subsequently formed instance of the structure, the control may be applied during formation of a layer 401 formed before the target layer 402 of the subsequently formed instance of the structure, during formation of the target layer 402 of the subsequently formed instance of the structure, or during formation of a layer 403 formed after the target layer 402 of the subsequently formed instance of the structure. In an embodiment, the control of the deposition process comprises controlling a stress distribution in the layer of material deposited by the deposition step. This may be achieved for example by controlling the temperature of the material during deposition, the speed at which the material is deposited, or any other factor that will affect the stress distribution. In an embodiment, the control of the deposition process alternatively or additionally comprises controlling one or more of the following in the layer of material deposited by the deposition step: a height distribution, a density distribution, a composition distribution.

In the example of FIG. 15, a patterning process is adjusted (controlled) to change the tilt in the etching path 420 itself. In the example shown the tilt is entirely removed. Removal (or reduction) of the tilt leads to better alignment of the etching path 420 with the lower reference feature 411. The tilt may be changed by controlling an etching process used to form the etching path 420 or by modifying stress distributions in the target layer 402 or in layers surrounding the target layer 402.

In an embodiment, the measured tilt is used to control an etching process applied to a subsequently formed instance of the structure on a substrate. The control may be applied during formation of a pattern in a layer 401 formed before the target layer 402 in the subsequently formed instance of the structure, during formation of a pattern in the target layer 402 in the subsequently formed instance of the structure, or during formation of a pattern in a layer 403 formed after the target layer 402 in the subsequently formed instance of the structure. In an embodiment, the measured tilt is used to control one or more etch parameters of the etching process. In an embodiment, the etching process is performed by the etching station 222 and the control is applied by passing control signals to the etch controller 223, as described above with reference to FIG. 2. In an embodiment, the control of the etching process comprises controlling one or more of the following: a thermal pattern across the substrate, a chemical concentration pattern in plasma used in the etching process, an electric field pattern surrounding the substrate during the etching process, a voltage applied to one or more electrodes during the etching process.

In the process flow depicted in FIG. 2 and described above, embodiments of the present disclosure may be implemented by performing the measurement of tilt on substrates output from the etching station 222 (path 420), on substrates output from the post-etch cleaning and/or annealing station 224 (path 421), and/or on substrates output from the further downstream processing apparatus 226 (path 422).

In embodiments of the present disclosure, the tilt is measured directly. The tilt is thus determined without needing to compare measurements made at different times on different structures. For example, the measurement of tilt does not require comparison to be made between a metrology measurement made on the target layer prior to the etching of the target layer that produces the tilted etching path and a metrology measurement made on the target layer when the tilted etching path is present or after the tilted etching path has been used to influence subsequent processing of the substrate. The measurement of tilt does not require comparison of overlay measurements made before and after the tilted etching path has been formed.

Direct measurement of tilt is particularly beneficial where multiple etching steps contribute cumulatively to an error such as overlay. Alternative approaches which rely on comparing an overlay value obtained before all of the multiple etching steps and an overlay value obtained after all of the multiple etching steps will not be able to distinguish between overlay caused by tilt in one of the etching steps and overlay caused by tilt in another etching step. Any prediction of tilt in structures formed by one of the etching steps obtained using such an approach will thus be prone to error because of the possibility of the tilt being different in one of the other etching steps. An example scenario is discussed below with reference to FIGS. 16-20.

Figure 16:
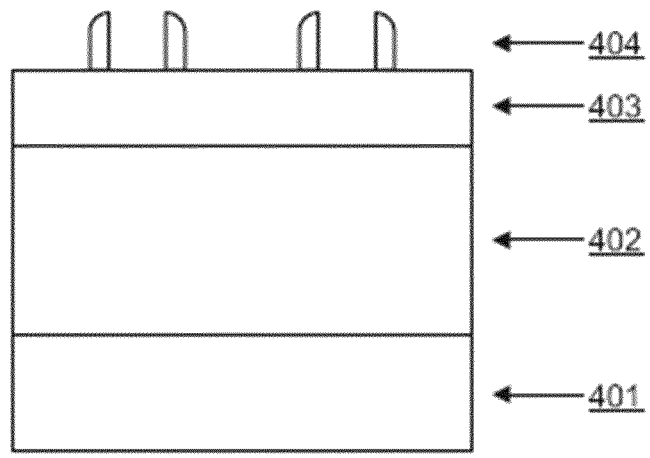
FIGS. 16-18 depict stages in an etching process comprising multiple steps.
Figure 17:
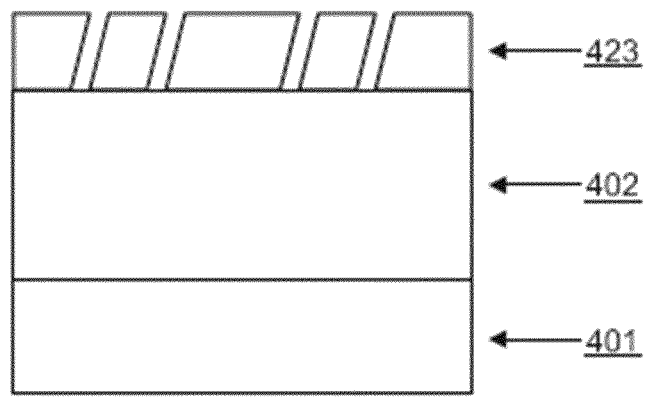

FIG. 16 depicts an example structure prior to a multiple etching process. The structure comprises a lower layer 401, a target layer 402, an upper layer 403, and a patterned layer 404. The patterned layer 404 acts as a mask in a first etching step. The first etching step etches a pattern into the upper layer 403 as shown in FIG. 17. In this embodiment the etched upper layer may be referred to as a hard mask layer 423. The first etching step forms tilted etching paths in the hard mask layer 423.

Figure 18:
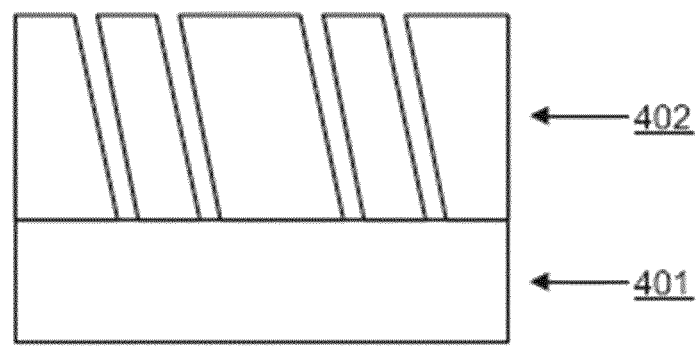

In a second etching step, a pattern is etched into the target layer 402. The pattern etched into the upper layer 403, which is the pattern within the hard mask layer 423, defines the pattern etched into the target layer 403. The hard mask layer 423 thus acts as a mask in the second etching step. FIG. 18 depicts the structure after completion of the second etching step. The second etching step forms tilted etching paths in the target layer 402. Etching parameters used in the first etching step may be different from etching parameters used in the second etching step. Tilts in etching paths produced by the first etching step may thus be different from tilts in etching paths produced by the second etching step.

Figure 19:
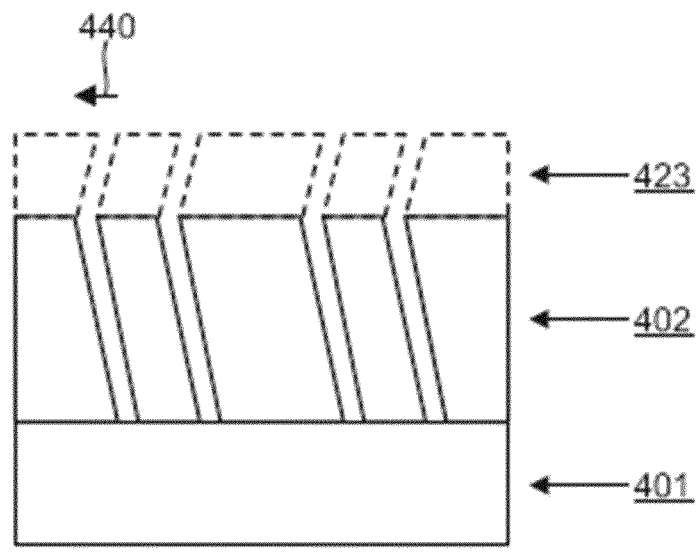
FIG. 19 depicts an apparent overlay caused by a tilt in an etching path through a layer above the target layer.

Overlay measurements can be made of the structure in FIG. 16 and the structure in FIG. 18. Overlay measurements of the structure of FIG. 16 can yield overlay error between layers 404 and 401. Overlay measurements of the structure of FIG. 18 can yield overlay error between the center of gravity of layer 402 and layer 401. Combining the two measurements yields overlay error between layer 404 and the center of gravity of layer 402. Referring to FIG. 19, such measurements would suggest a shift 440 of layer 402 relative to layer 404 that is smaller than has actually occurred due to the tilt of layer 402 because the tilt of layer 423 is in the opposite direction to the tilt in layer 402 (such that the tilts compensate for each other). Controlling the second etching step on the basis of this result only will cause a tilt to remain in the target layer 402, as depicted in the right hand path 441 shown in FIG. 20.

Figure 20:
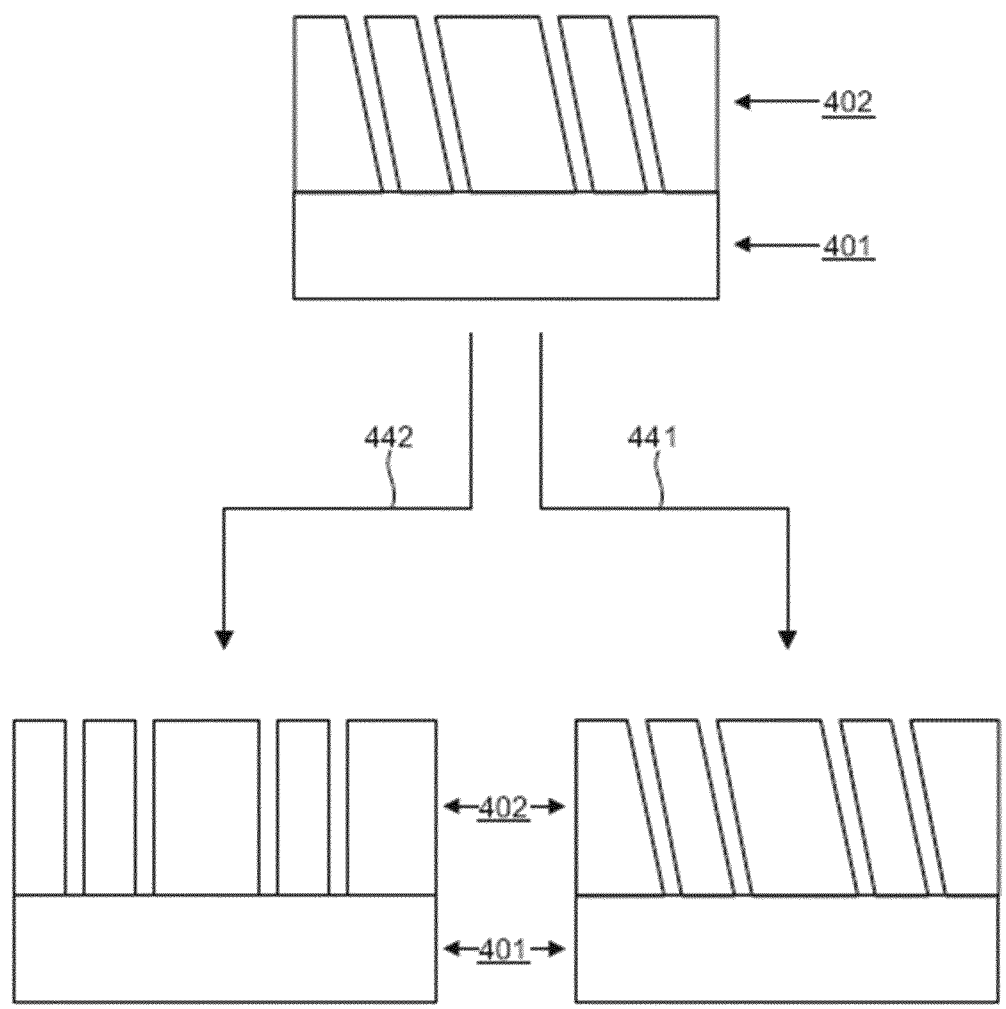
FIG. 20 compares the result of controlling etching of the target layer in the etching process of FIGS. 16-18 with (left) and without (right) direct measurement of tilt in the target layer.

If the method of the present disclosure is applied to measure the tilt in the target layer 402 directly, it is possible to avoid this error and provide more accurate reduction of the tilt in the target layer 402, as depicted in the left hand path 442 shown in FIG. 20.

In an embodiment, the method further comprises measuring overlay between patterns in different layers of the structure independently of the measurement of tilt in the etching path through the target layer 402. In the context of a patterning process comprising multiple etching steps such as that discussed above with reference to FIGS. 16-20, the measurement of overlay may be used in combination with the measured tilt in the target layer 402, and geometrical information about the layers concerned (e.g. thickness), to deduce tilt in an etching path in a layer other than the target layer (such as in the hard mask layer 423 in the example of FIGS. 16-20). The deduced tilt is used to control a patterning process used to form a pattern in said layer other than the target layer during formation of a subsequently formed instance of the structure. In the example above, the tilt caused by the first etching process may thus be deduced. The deduced tilt may be used to control the patterning process in any of the ways discussed above in relation to tilt in the target layer 402 (e.g. to reduce the tilt) Alternatively or additionally, a nominal overlay between the target layer 402 and a different layer is changed to compensate for the deduced tilt in the layer other than the target layer 402.

Figure 21:
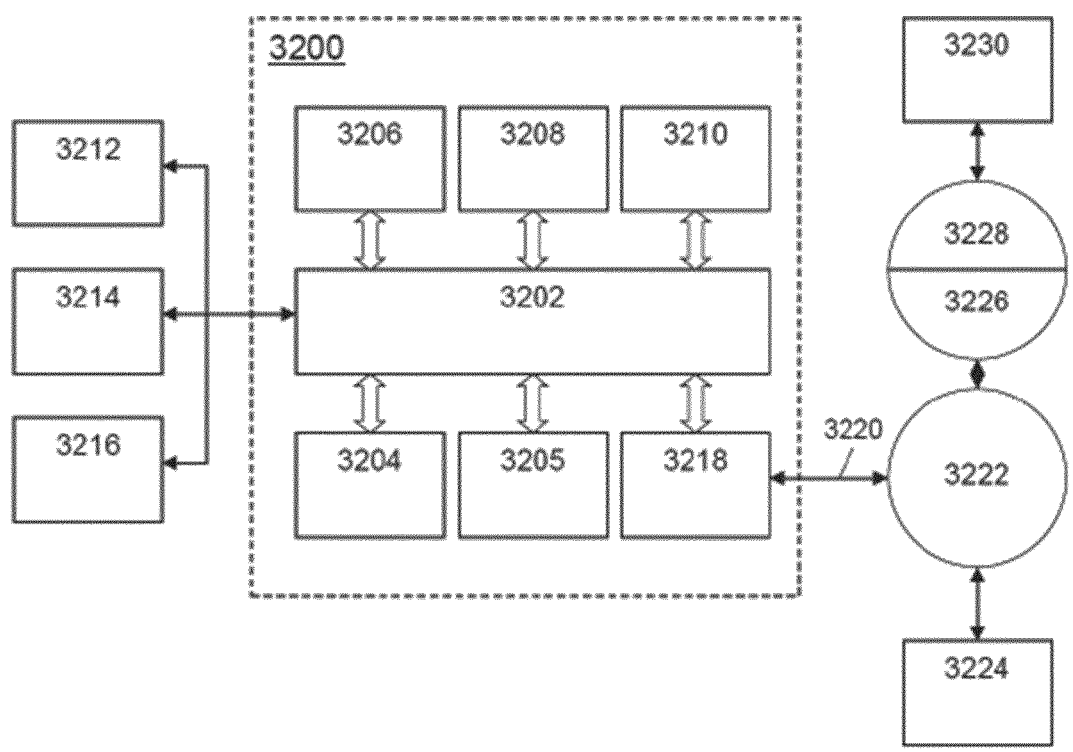
FIG. 21 schematically depicts a computer system which may implement embodiments of this disclosure.

Referring to FIG. 21, a computer system 3200 is shown. The computer system 3200 includes a bus 3202 or other communication mechanism for communicating information, and a processor 3204 (or multiple processors 3204 and 3205) coupled with bus 3202 for processing information. Computer system 3200 also includes a main memory 3206, such as a random access memory (RAM) or other dynamic storage device, coupled to bus 3202 for storing information and instructions to be executed by processor 3204. Main memory 3206 also may be used for storing temporary variables or other intermediate information during execution of instructions to be executed by processor 3204. Computer system 3200 further includes a read only memory (ROM) 3208 or other static storage device coupled to bus 3202 for storing static information and instructions for processor 3204. A storage device 3210, such as a magnetic disk or optical disk, is provided and coupled to bus 3202 for storing information and instructions.

Computer system 3200 may be coupled via bus 3202 to a display 3212, such as a cathode ray tube (CRT) or flat panel or touch panel display for displaying information to a computer user. An input device 3214, including alphanumeric and other keys, is coupled to bus 3202 for communicating information and command selections to processor 3204. Another type of user input device is cursor control 3216, such as a mouse, a trackball, or cursor direction keys for communicating direction information and command selections to processor 3204 and for controlling cursor movement on display 3212. This input device typically has two degrees of freedom in two axes, a first axis (e.g., x) and a second axis (e.g., y), that allows the device to specify positions in a plane. A touch panel (screen) display may also be used as an input device.

The computer system 3200 may be suitable to function as a processing unit herein in response to processor 3204 executing one or more sequences of one or more instructions contained in main memory 3206. Such instructions may be read into main memory 3206 from another computer-readable medium, such as storage device 3210. Execution of the sequences of instructions contained in main memory 3206 causes processor 3204 to perform a process described herein. One or more processors in a multi-processing arrangement may also be employed to execute the sequences of instructions contained in main memory 3206. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 3204 for execution. Such a medium may take many forms, including but not limited to, non-volatile media, volatile media, and transmission media. Non-volatile media include, for example, optical or magnetic disks, such as storage device 3210. Volatile media include dynamic memory, such as main memory 3206. Transmission media include coaxial cables, copper wire and fiber optics, including the wires that comprise bus 3202. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 3204 for execution. For example, the instructions may initially be borne on a magnetic disk of a remote computer. The remote computer can load the instructions into its dynamic memory and send the instructions over a telephone line using a modem. A modem local to computer system 3200 can receive the data on the telephone line and use an infrared transmitter to convert the data to an infrared signal. An infrared detector coupled to bus 3202 can receive the data carried in the infrared signal and place the data on bus 3202. Bus 3202 carries the data to main memory 3206, from which processor 3204 retrieves and executes the instructions. The instructions received by main memory 3206 may optionally be stored on storage device 3210 either before or after execution by processor 3204.

Computer system 3200 may also include a communication interface 3218 coupled to bus 3202. Communication interface 3218 provides a two-way data communication coupling to a network link 3220 that is connected to a local network 3222. For example, communication interface 3218 may be an integrated services digital network (ISDN) card or a modem to provide a data communication connection to a corresponding type of telephone line. As another example, communication interface 3218 may be a local area network (LAN) card to provide a data communication connection to a compatible LAN. Wireless links may also be implemented.

In any such implementation, communication interface 3218 sends and receives electrical, electromagnetic or optical signals that carry digital data streams representing various types of information.

Network link 3220 typically provides data communication through one or more networks to other data devices. For example, network link 3220 may provide a connection through local network 3222 to a host computer 3224 or to data equipment operated by an Internet Service Provider (ISP) 3226. ISP 3226 in turn provides data communication services through the worldwide packet data communication network, now commonly referred to as the "Internet" 3228. Local network 3222 and Internet 3228 both use electrical, electromagnetic or optical signals that carry digital data streams. The signals through the various networks and the signals on network link 3220 and through communication interface 3218, which carry the digital data to and from computer system 3200, are exemplary forms of carrier waves transporting the information.

Computer system 3200 can send messages and receive data, including program code, through the network(s), network link 3220, and communication interface 3218. In the Internet example, a server 3230 might transmit a requested code for an application program through Internet 3228, ISP 3226, local network 3222 and communication interface 3218. In accordance with one or more embodiments, one such downloaded application provides for a method as disclosed herein, for example. The received code may be executed by processor 3204 as it is received, and/or stored in storage device 3210, or other non-volatile storage for later execution. In this manner, computer system 3200 may obtain application code in the form of a carrier wave.

An embodiment of the disclosure may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may be made in this text to the use of a metrology apparatus in the manufacture of ICs, it should be understood that the metrology apparatus and processes described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or one or more various other tools. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example nanoimprint lithography, and where the context allows, is not limited to optical lithography. In the case of nanoimprint lithography, the patterning device is an imprint template or mold.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

References herein to crossing or passing a threshold may include something having a value lower than a specific value or lower than or equal to a specific value, something having a value higher than a specific value or higher than or equal to a specific value, something being ranked higher or lower than something else (through e.g., sorting) based on, e.g., a parameter, etc.

References herein to correcting or corrections of an error include eliminating the error or reducing the error to within a tolerance range.

The term "optimizing" and "optimization" as used herein refers to or means adjusting a lithographic apparatus, a patterning process, etc. such that results and/or processes of lithography or patterning processing have more a desirable characteristic, such as higher accuracy of projection of a design layout on a substrate, a larger process window, etc. Thus, the term "optimizing" and "optimization" as used herein refers to or means a process that identifies one or more values for one or more variables that provide an improvement, e.g. a local optimum, in at least one relevant metric, compared to an initial set of one or more values for those one or more variables. "Optimum" and other related terms should be construed accordingly. In an embodiment, optimization steps can be applied iteratively to provide further improvements in one or more metrics.

In an optimization process of a system, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

Further embodiments of the invention are disclosed in the list of numbered embodiments below:

1. A method of controlling a patterning process, comprising:
   obtaining tilt data resulting from a measurement of tilt in an etching path through a target layer of a structure on a substrate, the tilt representing a deviation in a direction of the etching path from a perpendicular to the plane of the target layer; and
   using the tilt data to control a patterning process used to form a pattern in a further layer.
2. The method of embodiment 1, wherein the patterning process comprises an etching process and the tilt data is used to control the etching process.
3. The method of embodiment 2, wherein the control of the etching process is applied during formation by the etching process of a pattern in a layer above the target layer.
4. The method of embodiment 2 or 3, wherein the control of the etching process is applied during formation by the etching process of a pattern in a layer in or on a subsequently formed instance of the structure.
5. The method of any of embodiments 2-4, wherein the control of the etching process comprises controlling one or more of the following: a thermal pattern across a substrate, a chemical concentration pattern in plasma used in the etching process, an electric field pattern surrounding a substrate during the etching process, a voltage applied to one or more electrodes during the etching process.
6. The method of any preceding embodiment, wherein:
   the patterning process comprises a lithographic pattern transfer step in which a patterning device is used to impart a radiation beam with a pattern in its cross-section to define a pattern to be transferred by the lithographic pattern transfer step; and
   the tilt data is used to control the lithographic pattern transfer step.
7. The method of embodiment 6, wherein the control of the lithographic pattern transfer step is applied during formation by the lithographic pattern transfer step of a pattern in a layer above the target layer.
8. The method of embodiment 6 or 7, wherein the control of the lithographic pattern transfer step is applied during formation by the lithographic pattern transfer step of a pattern in a layer in or on a subsequently formed instance of the structure.
9. The method of any of embodiments 6-8, wherein the control of the lithographic pattern transfer step comprises modifying the patterning device.
10. The method of any of embodiments 6-9, wherein the control of the lithographic pattern transfer step comprises modifying one or more of the following: a dose applied by the radiation beam, a focus of the radiation beam, one or more optical aberrations applied to the radiation beam.
11. The method of any of embodiments 6-10, wherein the control of the lithographic pattern transfer step comprises changing a nominal overlay between a pattern formed in a layer by the lithographic pattern transfer step and a pattern in a different layer.
12. The method of any preceding embodiment, wherein the patterning process comprises a deposition step in which a layer of material is deposited, and the measured tilt is used to control the deposition step.
13. The method of embodiment 12, wherein the control of the deposition step is applied during formation by the deposition step of a layer above the target layer.

14. The method of embodiment 12 or 13, wherein the control of the deposition step is applied during formation by the deposition step of a layer in or on a subsequently formed instance of the structure.

15. The method of any of embodiments 12-14, wherein the control of the deposition step comprises controlling one or more of the following in the layer of material deposited by the deposition step: a stress distribution, a height distribution, a density distribution, a composition distribution.

16. The method of any preceding embodiment, wherein the structure is formed by an etching process comprising:
   a first etching step in which a pattern is etched into a layer above the target layer; and
   a second etching step in which a pattern is etched into the target layer,
   wherein the pattern etched into the layer above the target layer defines the pattern etched into the target layer.

17. The method of embodiment 16, further comprising measuring overlay between patterns in different layers of the structure independently of the measurement of tilt in the etching path through the target layer.

18. The method of embodiment 17, wherein:
   the measured overlay is used in combination with the measured tilt in the target layer to deduce a tilt in an etching path in the layer etched by the first etching step.

19. The method of embodiment 18, wherein the deduced tilt is used to control the first etching process during formation of a subsequently formed instance of the structure.

20. The method of embodiment 18 or 19, wherein a nominal overlay between the target layer and a different layer is changed to compensate for the deduced tilt.

21. The method of any of embodiments 1-15, further comprising measuring overlay between patterns in different layers of the structure independently of the measurement of tilt in the etching path through the target layer.

22. The method of any preceding embodiment, wherein the measurement of tilt comprises a direct measurement of tilt.

23. The method of any preceding embodiment, wherein the measurement of tilt comprises a non-destructive measurement of tilt.

24. The method of any preceding embodiment, comprising performing the measurement of tilt.

25. The method of any preceding embodiment, wherein the measurement of tilt comprises illuminating the structure with radiation and detecting radiation redirected by the structure.

26. The method of embodiment 25, wherein the detected radiation is primarily zeroth order radiation.

27. The method of any of embodiments 25-26, wherein the tilt is extracted from an asymmetric component of a detected representation of radiation redirected by the structure.

28. The method of embodiment 27, wherein the detected representation comprises a detected pupil representation.

29. The method of any preceding embodiment, wherein the structure comprises a device structure.

30. The method of any preceding embodiment, wherein the structure comprises a non-device structure within a substrate die comprising a device structure.

31. A device manufacturing method, comprising:
   forming a structure comprising a target layer on a substrate;
   obtaining tilt data resulting from a measurement of tilt in an etching path through the target layer, the tilt representing a deviation in a direction of the etching path from a perpendicular to the plane of the target layer; and
   using the tilt data to control a patterning process used to form a pattern in a further layer.

32. A computer program product comprising a computer non-transitory readable medium having instructions thereon, the instructions when executed by a computer implementing the method of any of embodiments 1-30.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequence, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The descriptions above are intended to be illustrative, not limiting. Thus, it will be apparent to one skilled in the art that modifications may be made to the disclosure as described without departing from the scope of the claims set out below.

The invention claimed is:

1. A method of controlling a patterning process, the method comprising:
   obtaining tilt data resulting from a measurement of tilt in an etching path through a target layer of a structure on a substrate, the etching path occurring, or occurred, during an etching of the substrate and the tilt representing a deviation in a direction of the etching path from a perpendicular to the plane of the target layer; and
   using the tilt data to control a patterning process used to form a pattern in a further layer,
   wherein;
   the measurement of tilt comprises illumination, toward the plane of the target layer, of the structure with radiation and detection of radiation redirected by the structure,
   the patterning process comprises a lithographic pattern transfer step in which a patterning device is used to impart a radiation beam with a pattern in its cross-section to define a pattern to be transferred by the lithographic pattern transfer step,
   the tilt data is used to control the lithographic pattern transfer step,
   the control of the lithographic pattern transfer step comprises changing a nominal overlay between a pattern formed in a layer by the lithographic pattern transfer step and a pattern in a different layer.

2. The method of claim 1, wherein the patterning process comprises an etching process and the tilt data is used to control the etching process.

3. The method of claim 2, wherein the control of the etching process is applied during formation, by the etching process, of a pattern in a layer above the target layer.

4. The method of claim 2, wherein the control of the etching process is applied during formation, by the etching process, of a pattern in a layer in, or on, a subsequently formed instance of the structure.

5. The method of claim 2, wherein the control of the etching process comprises controlling one or more selected from: a thermal pattern across a substrate, a chemical concentration pattern in plasma used in the etching process, an electric field pattern surrounding a substrate during the etching process, and/or a voltage applied to one or more electrodes during the etching process.

6. The method of claim 1, wherein the control of the lithographic pattern transfer step is applied during formation, by the lithographic pattern transfer step, of a pattern in a layer above the target layer.

7. The method of claim 1, wherein the control of the lithographic pattern transfer step comprises modifying one or more selected from: a dose applied by the radiation beam, a focus of the radiation beam, and/or one or more optical aberrations applied to the radiation beam.

8. The method of claim 1, wherein the structure is formed by an etching process comprising:
   a first etching step in which a pattern is etched into a layer above the target layer; and
   a second etching step in which a pattern is etched into the target layer,
   wherein the pattern etched into the layer above the target layer defines the pattern etched into the target layer.

9. The method of claim 8, further comprising measuring overlay between patterns in different layers of the structure independently of the measurement of tilt in the etching path through the target layer.

10. The method of claim 9, wherein the measured overlay is used in combination with the measured tilt in the target layer to deduce a tilt in an etching path in the layer etched by the first etching step.

11. The method of claim 10, wherein the deduced tilt is used to control the first etching process during formation of a subsequently formed instance of the structure.

12. The method of claim 10, wherein a nominal overlay between the target layer and a different layer is changed to compensate for the deduced tilt.

13. The method of claim 1, wherein the detected radiation is primarily zeroth order radiation.

14. The method of claim 1, wherein the tilt is extracted from an asymmetric component of a detected representation of radiation redirected by the structure.

15. The method of claim 1, wherein the structure comprises a device structure.

16. A method of controlling a patterning process, the method comprising:
   obtaining tilt data resulting from a measurement of tilt in an etching path through a target layer of a structure on a substrate, the etching path occurring, or occurred, during an etching of the substrate and the tilt representing a deviation in a direction of the etching path from a perpendicular to the plane of the target layer; and
   using the tilt data to control a patterning process used to form a pattern in a further layer, wherein:
      the measurement of tilt comprises illumination, toward the plane of the target layer, of the structure with radiation and detection of primarily zeroth order radiation redirected by the structure,
      the patterning process comprises a lithographic pattern transfer step in which a patterning device is used to impart a radiation beam with a pattern in its cross-section to define a pattern to be transferred by the lithographic pattern transfer step, and
      the tilt data is used to control the lithographic pattern transfer step.

17. A method of controlling a patterning process, the method comprising:
   obtaining tilt data resulting from a measurement of tilt in an etching path through a target layer of a structure on a substrate, the etching path occurring, or occurred, during an etching of the substrate and the tilt representing a deviation in a direction of the etching path from a perpendicular to the plane of the target layer; and using the tilt data to control a patterning process used to form a pattern in a further layer, wherein the measurement of tilt comprises illumination, toward the plane of the target layer, of the structure with radiation and detection of radiation redirected by the structure, and wherein the tilt is extracted from an asymmetric component of a detected representation of radiation redirected by the structure.

18. A method of controlling a patterning process, the method comprising:

obtaining tilt data resulting from a measurement of tilt in an etching path through a target layer of a structure on a substrate, the etching path occurring, or occurred, during an etching of the substrate and the tilt representing a deviation in a direction of the etching path from a perpendicular to the plane of the target layer; and using the tilt data to control a patterning process used to form a pattern in a further layer, wherein:

the measurement of tilt comprises illumination, toward the plane of the target layer, of the structure with radiation and detection of radiation redirected by the structure, the structure is formed by an etching process comprising:

a first etching step in which a pattern is etched into a layer above the target layer, and a second etching step in which a pattern is etched into the target layer, wherein the pattern etched into the layer above the target layer defines the pattern etched into the target layer; and measuring overlay between patterns in different layers of the structure independently of the measurement of tilt in the etching path through the target layer.

\* \* \* \* \*